(12) United States Patent
Wiggins

(10) Patent No.: US 10,551,448 B2
(45) Date of Patent: Feb. 4, 2020

(54) TRELLIS COIL ARRANGEMENT AND METHODS FOR USE THEREOF

(71) Applicant: NEW YORK UNIVERSITY, New York, NY (US)

(72) Inventor: Graham Wiggins, New York, NY (US)

(73) Assignee: New York University, New York, NY (US)

( * ) Notice: Subject to any disclaimer, the term of this patent is extended or adjusted under 35 U.S.C. 154(b) by 220 days.

(21) Appl. No.: 15/495,338

(22) Filed: Apr. 24, 2017

(65) Prior Publication Data

US 2018/0045794 A1 Feb. 15, 2018

Related U.S. Application Data

(60) Provisional application No. 62/326,127, filed on Apr. 22, 2016.

(51) Int. Cl.
*G01R 33/34* (2006.01)
*G01R 33/36* (2006.01)

(52) U.S. Cl.
CPC ............. *G01R 33/34* (2013.01); *G01R 33/36* (2013.01)

(58) Field of Classification Search
CPC ................................ G01R 33/34; G01R 33/36
See application file for complete search history.

(56) References Cited

U.S. PATENT DOCUMENTS

| | | | | |
|---|---|---|---|---|
| 5,666,055 A * | 9/1997 | Jones | ................ | G01R 33/3415 324/318 |
| 6,137,291 A * | 10/2000 | Szumowski | ..... | G01R 33/34084 324/318 |
| 8,487,620 B2 * | 7/2013 | Brown | ................ | A61B 5/0555 324/318 |
| 8,723,522 B2 * | 5/2014 | Ma | ................... | G01R 33/34007 324/318 |
| 2007/0262777 A1 * | 11/2007 | Warntjes | ............ | G01R 33/3657 324/318 |

(Continued)

OTHER PUBLICATIONS

Nordmeyer-Massner, J.A. et al., "Mechanically Adjustable Coil Array for Wrist MRI," Magnetic Resonance in Medicine, vol. 61, pp. 429-438, 2009.

(Continued)

*Primary Examiner* — Dixomara Vargas
(74) *Attorney, Agent, or Firm* — Hunton AK LLP

(57) ABSTRACT

A further exemplary embodiment of the present disclosure can be, for example, a coil arrangement, which can include a loops including a plurality of first conductors extending in a first direction; a plurality of second conductors extending in a second direction, where the first direction is different from the second direction, and a plurality of linking points linking the first conductors to the second conductors, where the loop(s) can be configured to stretch in a third direction, and a perimeter of the loop is constant. The third direction can be different from the first and second directions, or it can be the same as the first direction or the second direction. The linking points can mechanically and pivotally connect the first conductors to the second conductors. The linking points can include flexible conductors, or the linking points can link the first conductors and the second conductors to a substrate. The substrate can be a trellis substrate.

21 Claims, 26 Drawing Sheets

(56) References Cited

U.S. PATENT DOCUMENTS

| | | | | |
|---|---|---|---|---|
| 2008/0007250 | A1* | 1/2008 | Wiggins | A61B 5/055 324/200 |
| 2008/0238424 | A1* | 10/2008 | Possanzini | G01R 33/341 324/318 |
| 2008/0284435 | A1* | 11/2008 | Overweg | G01R 33/341 324/318 |
| 2009/0230965 | A1* | 9/2009 | DeVries | G01R 33/3403 324/322 |
| 2011/0121830 | A1* | 5/2011 | Ma | G01R 33/34007 324/318 |
| 2015/0077116 | A1* | 3/2015 | Ma | G01R 33/34007 324/322 |
| 2015/0355297 | A1* | 12/2015 | Menon | G01R 33/365 324/322 |
| 2015/0369886 | A1* | 12/2015 | Menon | G01R 33/365 324/322 |
| 2016/0095552 | A1* | 4/2016 | Ha | A61B 5/6887 600/422 |
| 2017/0074956 | A1* | 3/2017 | Rosen | G01R 33/34046 |
| 2017/0299670 | A1* | 10/2017 | Tramm | G01R 33/3453 |
| 2018/0263561 | A1* | 9/2018 | Jones | A61B 5/6831 |
| 2018/0329005 | A1* | 11/2018 | Sodickson | G01R 33/34007 |

OTHER PUBLICATIONS

Orzada, Stephan et al., "RF Excitation Using Time Interleaved Acquisition of Modes . . . ," Magnetic Resonance in Medicine, vol. 64, pp. 327-333, 2010.

Klose, Uwe, "Mapping of the Radio Frequency Magnetic Field," Med. Phys. vol. 19, No. 4, pp. 1099-1104, 1992.

Orzada, Stephan et al., "Design and Comparision of Two Eight-Channel Transmit/receive . . . ," Med. Phys. vol. 37, No. 5, pp. 2225-2232, May 2010.

Lee, Wonje et al., "Parallel Transceiver Array Design Using the Modified . . . ," Proc. Intl. Soc. Mag. Reson. Med., vol. 21, p. 0292, 2013.

Adriany, Gregor et al., "A Geometrically Adjustable 16-Channel Transmit/Receive . . . ," Magnetic Resonance in Medicine, vol. 59, pp. 590-597, 2008.

Nordmeyer-Massner, J.A. et al., "Stretchable Coil Arrays: Application to Knee Imaging . . . ," Magnetic Resonance in Medicine, vol. 67, pp. 872-879, 2012.

Raaijmakers, J.M.T. et al. "The Fractionated Dipole Antenna: A New Antenna for Body Imaging at 7 Tesla," Magnetic Resonance in Medicine, vol. 75, Issue 3, pp. 1366-1374, Mar. 2016, pp. 1366-1374, [Retrieved from Internet] Version of Record online: May 2, 2015, DOI: 10.1002/mrm.25596.

Raaijmakers, J.M.T. et al. "Enzymatically Active Ultrathin Pepsin Membranes," Angewandte Chemie International Edition, vol. 54, Issue 20, pp. 5910-5914, May 11, 2015, [Retrieved from Internet] Version of Record online : Mar. 16, 2015, DOI: 10.1002/anie. 201411263.

Raaijmakers, J.M.T. et al. "Enzymatically Active Ultrathin Pepsin Membranes," Angewandte Chemie, vol. 127, Issue 20, pp. 6008-6012, May 11, 2015, [Retrieved from Internet] Version of Record online : Mar. 16, 2015, DOI: 10.1002/ange.201411263.

Raaijmakers, J.M.T. et al. "Inside Back Cover: Enzymatically Active Ultrathin Pepsin Membranes," Angewandte Chemie International Edition, vol. 54, Issue 20, p. 6067, May 11, 2015, [Retrieved from Internet] Version of Record online: Apr. 27, 2015, DOI: 10.1002/anie.201503395.

Raaijmakers, J.M.T. et al. "Innenrücktitelbild: Enzymatically Active Ultrathin Pepsin Membranes," Angewandte Chemie, vol. 127, Issue 20, p. 6165, May 11, 2015, [Retrieved from Internet] Version of Record online : Apr. 27, 2015, DOI: 10.1002/ange.201503395.

Zhange, Bei et al., "A Size-Adaptable Electric Dipole Array for 7T Body Imaging," ISMRM, p. 6101, 2016.

Wiggins, Graham et al., "The Trellis Coil: A Morphing, Size Adaptable Array Coil," ISMRM, p. 3502, 2016.

Wiggins, Graphm et al., "Size-Adaptable "Trellis" Recieve Array Concept for Knee Imaging," ISMRM, p. 493, 2016.

* cited by examiner

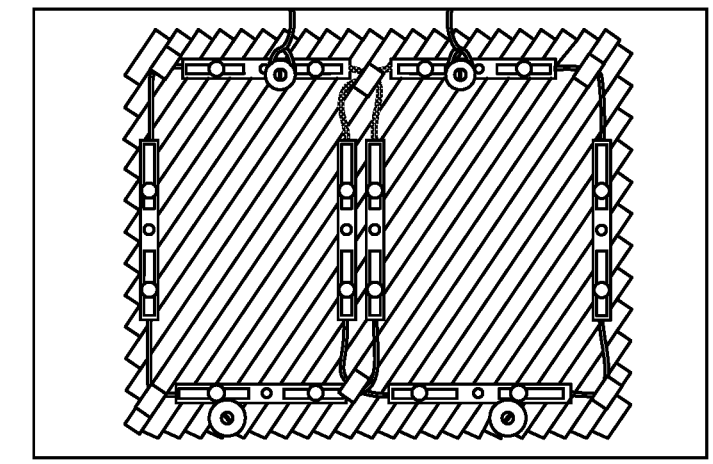
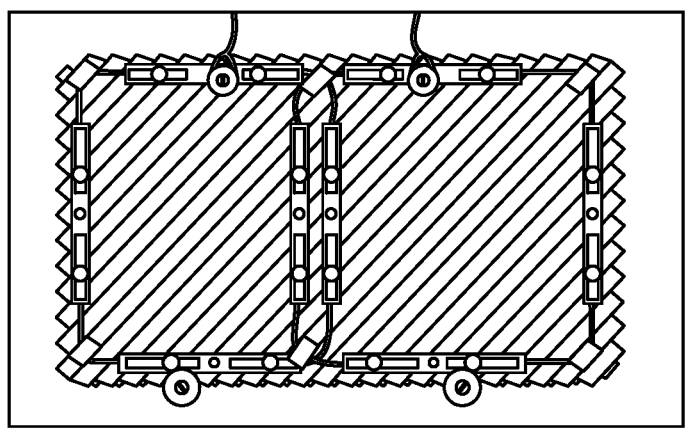
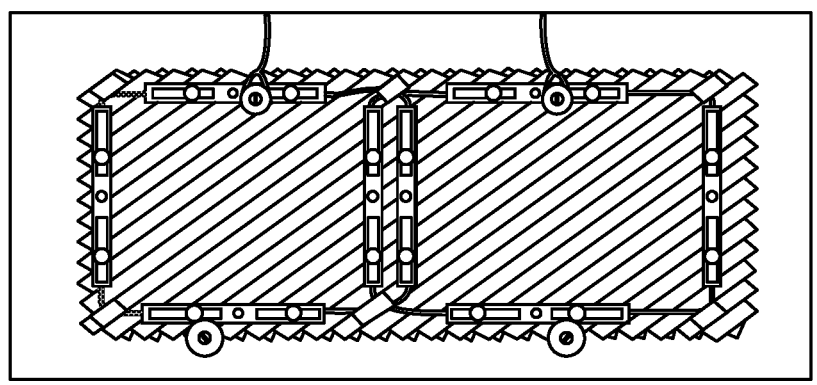
FIG. 8A

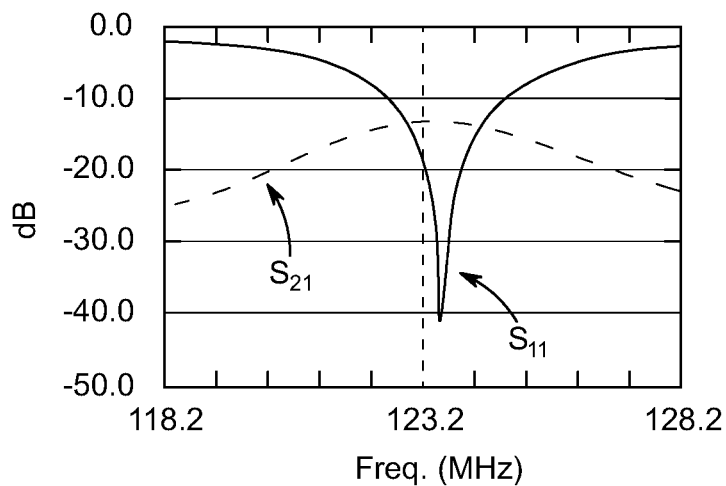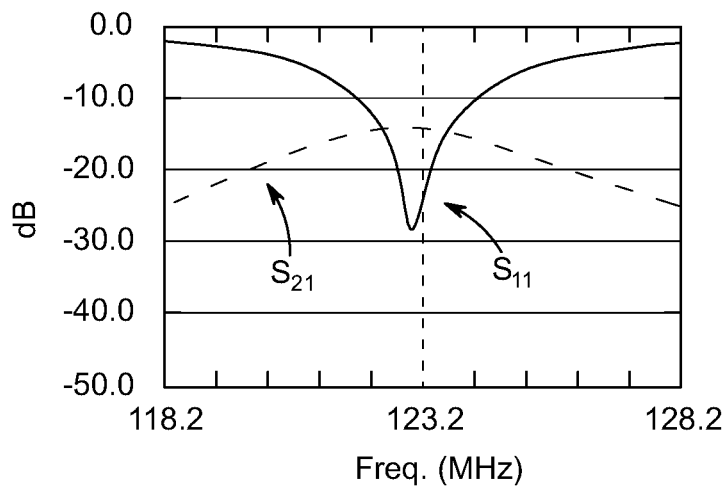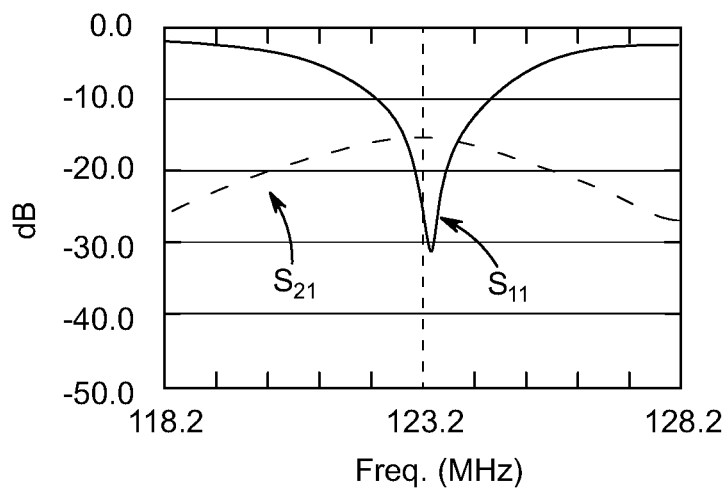
FIG. 8B

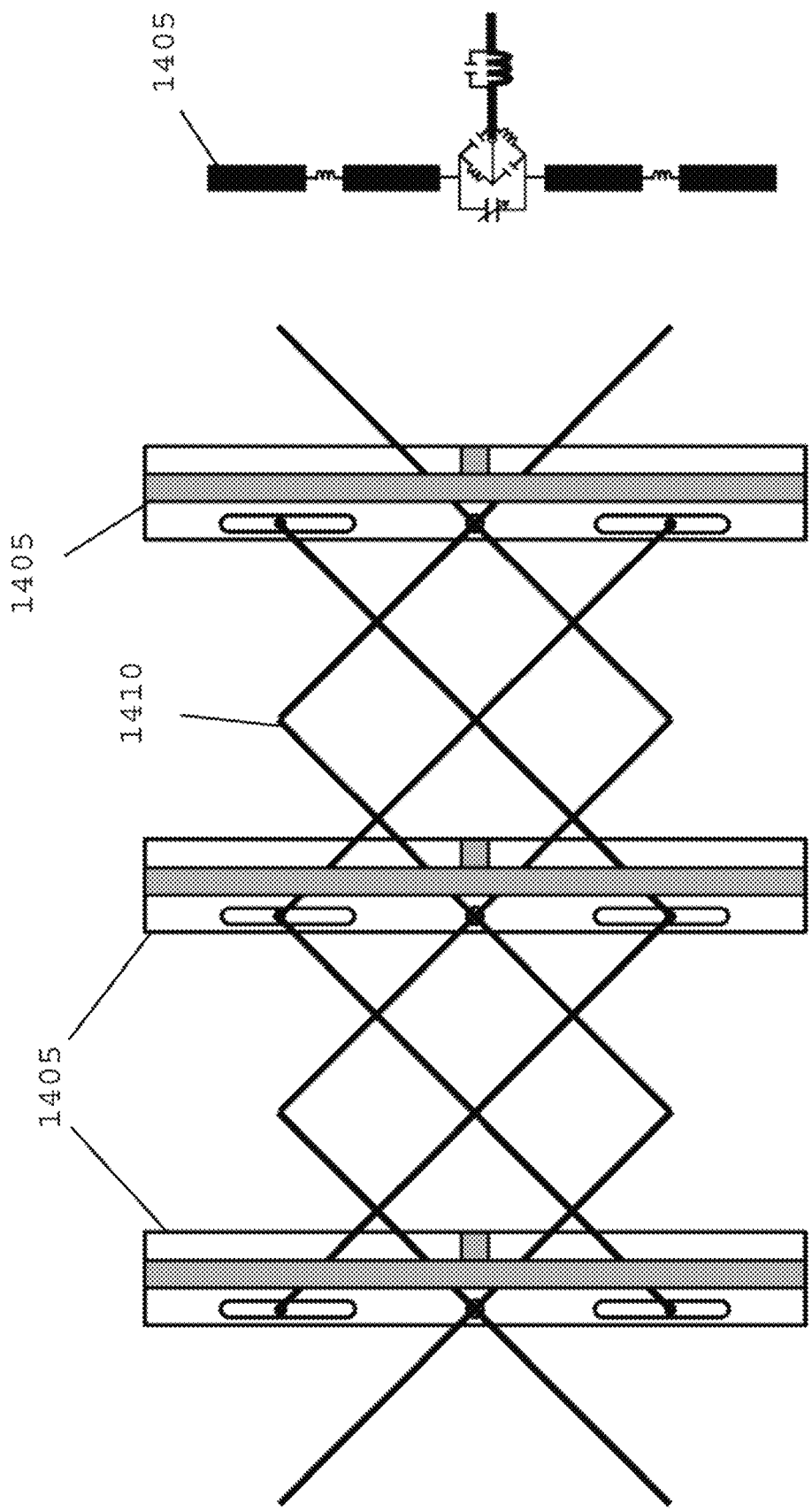

TRELLIS COIL ARRANGEMENT AND METHODS FOR USE THEREOF

CROSS-REFERENCE TO RELATED APPLICATION(S)

This application relates to and claims priority from U.S. Patent Application No. 62/326,127, filed on Apr. 22, 2016, the entire disclosure of which is incorporated herein by reference.

FIELD OF THE DISCLOSURE

The present disclosure relates generally to a magnetic resonance imaging ("MRI") coil, and more specifically, to exemplary embodiments of a trellis coil arrangement and methods for use thereof.

BACKGROUND INFORMATION

Receive coil array performance can generally be maximized when the array conforms closely to the body. However, people vary in size, which can make it difficult for one coil array to fit optimally on all subjects. This can be particularly the case for rigid coils, such as knee coils, which need to be made large enough to accommodate most people, but which may not be optimal on smaller bodies due to its large size. With the increasing prevalence of obesity, there are many people who do not even fit into the standard commercially available knee coils, and must be imaged with improvised arrangements of body array coils.

Several coil array designs have been proposed which adapt to the size of the object being imaged, either by facilitating fixed-size coil elements to move (see e.g., Reference 1) or by physically stretching coil elements made from a copper braid. (See e.g., Reference 2). Both of these approaches, however, lead to changes in coil tuning, match, and decoupling such that the optimum noise-matched impedance may not always be presented to the preamp. A size-adjustable stripline head array has been presented which addresses some of these issues with a mechanically driven decoupling mechanism. (See e.g., Reference 3). However, it does not overcome all of the issues with the above-described approaches.

The sensitivity of surface coil arrays can be maximized by conforming them closely to the human body, which can maximize coil loading. There can be, however, great diversity in body shape and size. Rigid coils must adopt a compromise, facilitating the largest cases while not giving up too much sensitivity when imaging smaller objects. Flexible arrays can be wrapped tightly around the body, but if array dimensions are fixed, there will always be gaps or undesired overlaps depending on body habitus.

Thus, it may be beneficial to provide an exemplary trellis coil arrangement and exemplary methods for use thereof that overcome at least some of the deficiencies described herein above.

SUMMARY OF EXEMPLARY EMBODIMENTS

An exemplary embodiment of the present disclosure can be or include, for example, a coil arrangement, which can include a loop(s) including a plurality of first conductors extending in a first direction, a plurality of second conductors extending in a second direction, where the first direction can be different from the second direction, and a plurality of linking points linking the first conductors to the second conductors, where the loop(s) can be configured to stretch in a third direction, and where a perimeter of the loops(s) can be constant. The third direction can be different from the first and second directions, or it can be the same as the first direction or the second direction. The linking points can mechanically and pivotally connect the first conductors to the second conductors. The linking points can include flexible conductors. Further linking points can link the first conductors and the second conductors to a substrate. The substrate can be a trellis substrate. An angle formed by a particular first conductor overlaid with a particular second conductor can be variable.

In some exemplary embodiments of the present disclosure, the linking points can include a slot or a hole. The trellis structure can include a lattice structure having a plurality of linked slats. The lattice structure can include a plurality of spaced apart parallel strips of material that can be laid in two layers, where the parallel strips of a first layer of the layers can be oriented at an angle greater than 5 degrees and less than 85 degrees from the parallel strips of a second layer of the layers, and where the first layer and the second layer can be connected to each other using a plurality of crossing points that can facilitate a change in an angle between the parallel strips of the first layer and the parallel strips of the second layer. The crossing points can be rivets or hinges.

In certain exemplary embodiments of the present disclosure, the lattice structure can include at least 10 equally spaced strips across a width of the loop(s). The lattice structure can include a plurality of strips, where an angle between the strips can be approximately 90 degrees. The lattice structure can be shaped as a cylinder. A plurality of further loops can be included, each of the further loops can include a plurality of third conductors extending in the first direction, a plurality of fourth conductors extending in the second direction, and plurality of further linking points linking the third conductors to the fourth conductors, where the further loop(s) can be configured to stretch in the third direction. The loop(s) and the further loops can overlap.

In some exemplary embodiments of the present disclosure, the loop(s) and the further loops can form a row of loops around a cylinder. The loop(s) and one of the further loops can be configured to null a mutual inductance of the loop(s) and the one of the further loops. The loop(s) and the further loops can each form a parallelogram, which can be a rectangle. A radio frequency ("RF") arrangement can be included which can be configured to (i) generate a first RF signal(s) to be transmitted by the coil arrangement and/or (ii) receive a second RF signal(s) using the coil arrangement. The first conductors can include two parallel first conductors, the second conductors can include two parallel second conductors, a first one of the two parallel first conductors can be connected to a first one of the two parallel second conductors by a first flexible conductor, a second one of the two parallel first conductors can be connected to the first one of the two parallel second conductors by a second flexible conductor, a second one of the two parallel second conductors can be connected to the second one of the two parallel first conductors by a third flexible conductor, and the first one of the two parallel first conductors can be connected to the second one of the two parallel second conductors by a fourth flexible conductor.

Further exemplary embodiments of the present disclosure can be, for example, a coil arrangement, which can include a base portion having an adjustable shape, at least two first conductors oriented in a first direction, at least two second conductors oriented in a second direction, where the second direction can be different from the first direction, at least two connecting conductors, one of the at least two connecting conductors electrically connecting one of the at least two first conductors to one of the at least two second conductors, and the other of the at least two connecting conductors electrically connecting the other of the at least two first conductors to the other of the at least two second conductors, and a plurality of linking points inserted in the base portion and/or connected to the base portion, where the linking points can mechanically connect the at least two first conductors and the at least two second conductors to the base portion. The at least two connecting conductors can be flexible.

In some exemplary embodiments of the present disclosure, the at least two first conductors, the at least two second conductors and the at least two connecting conductors can form a loop, and a perimeter of the loop can be constant. A plurality of corner stays can be provided around which the connecting conductors can be wrapped. The base portion can be a lattice structure, and the base portion can be shaped as a cylinder.

In certain exemplary embodiments of the present disclosure, the coil arrangement can further include, at least two third conductors, at least two fourth conductors, at least two further connecting conductors, one of the at least two further connecting conductors electrically connecting one of the at least two third conductors to one of the at least two fourth conductors, and the other of the at least two further connecting conductors electrically connecting the other of the at least two third conductors to the other of the at least two fourth conductors, and a plurality of further linking points at least one of inserted in the base portion or connected to the base portion, where the further linking points can mechanically connect the at least two third conductors and the at least two fourth conductors to the base portion. The at least two first conductors and the at least two second conductors can form a first loop and the at least two third conductors and the at least two fourth conductors can form a second loop, and the first loop and the second loop can overlap.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIG. 8A is a set of images illustrating the exemplary RF coil array for three different states of expansion according to an exemplary embodiment of the present disclosure;

FIG. 8B is a set of graphs corresponding to the exemplary coil from FIG. 8A according to an exemplary embodiment of the present disclosure;

FIG. 14A is a schematic diagram of exemplary electric dipole antennas distributed on an interlinked lattice structure according to an exemplary embodiment of the present disclosure;

FIG. 14B is a schematic diagram of an electric dipole element according to an exemplary embodiment of the present disclosure;

Figure 19:
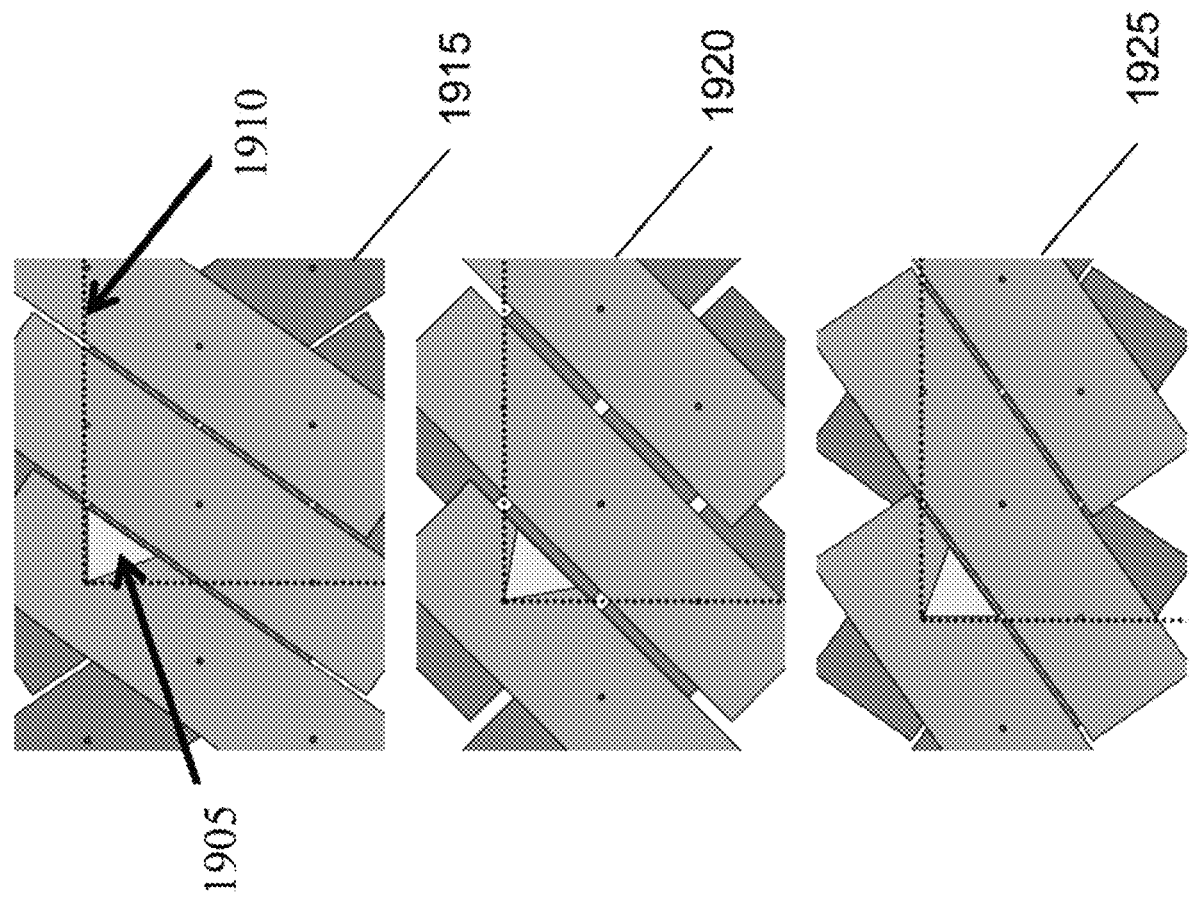
Figure 20:
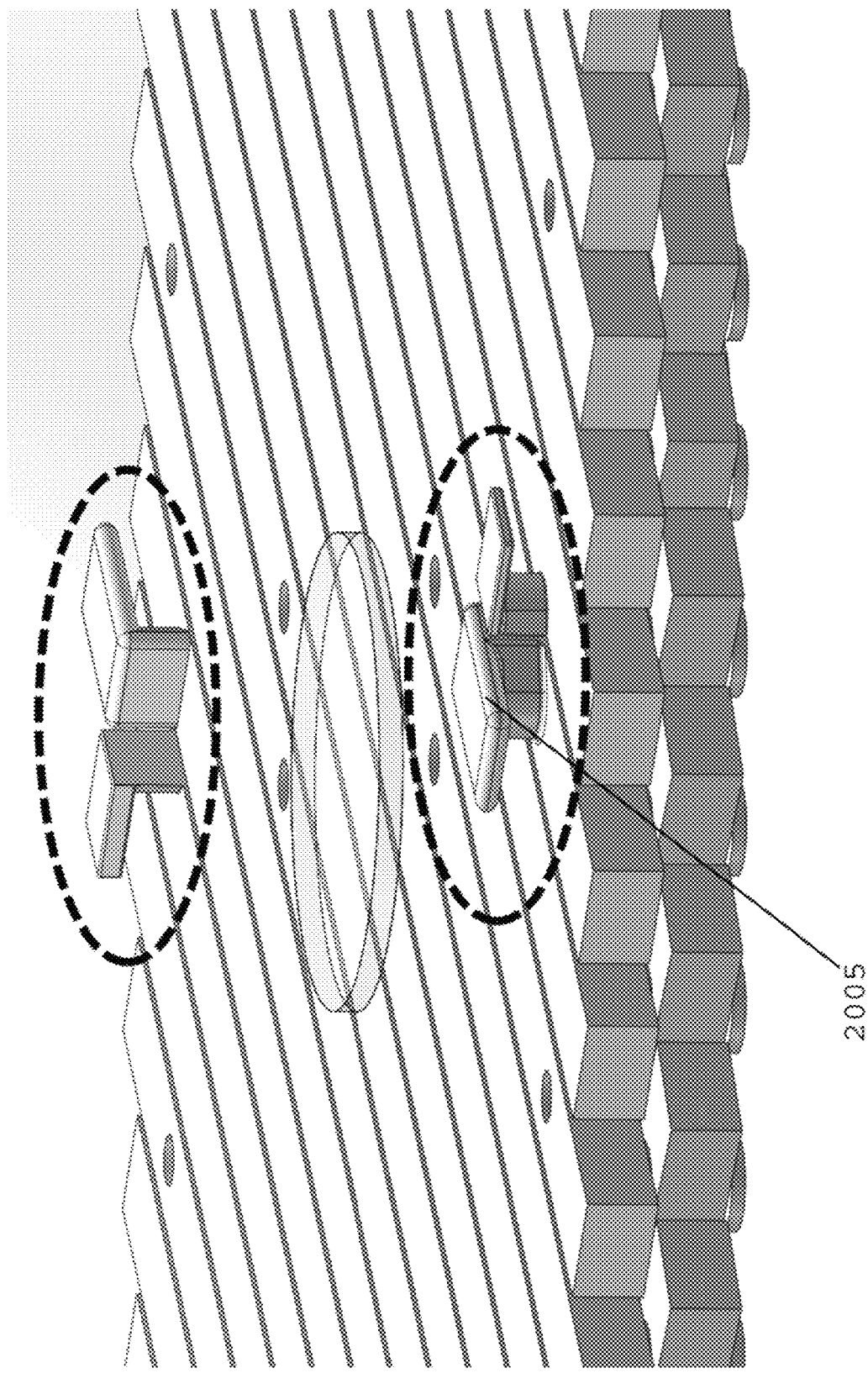
Figure 21:
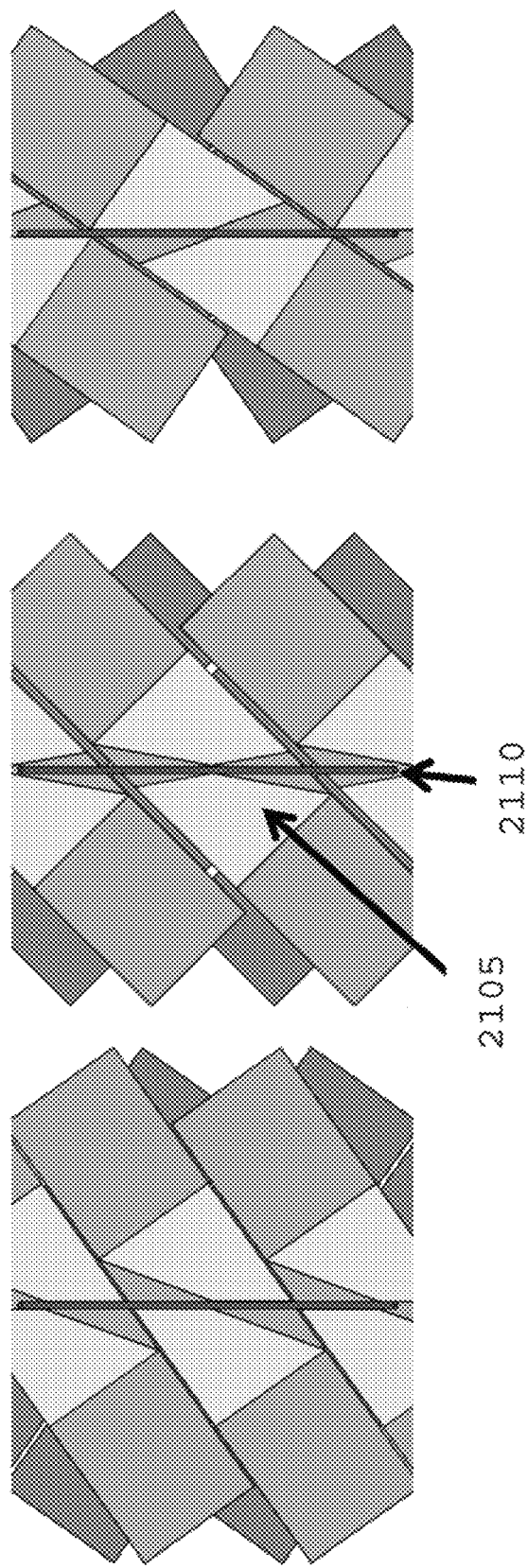
Figure 22:
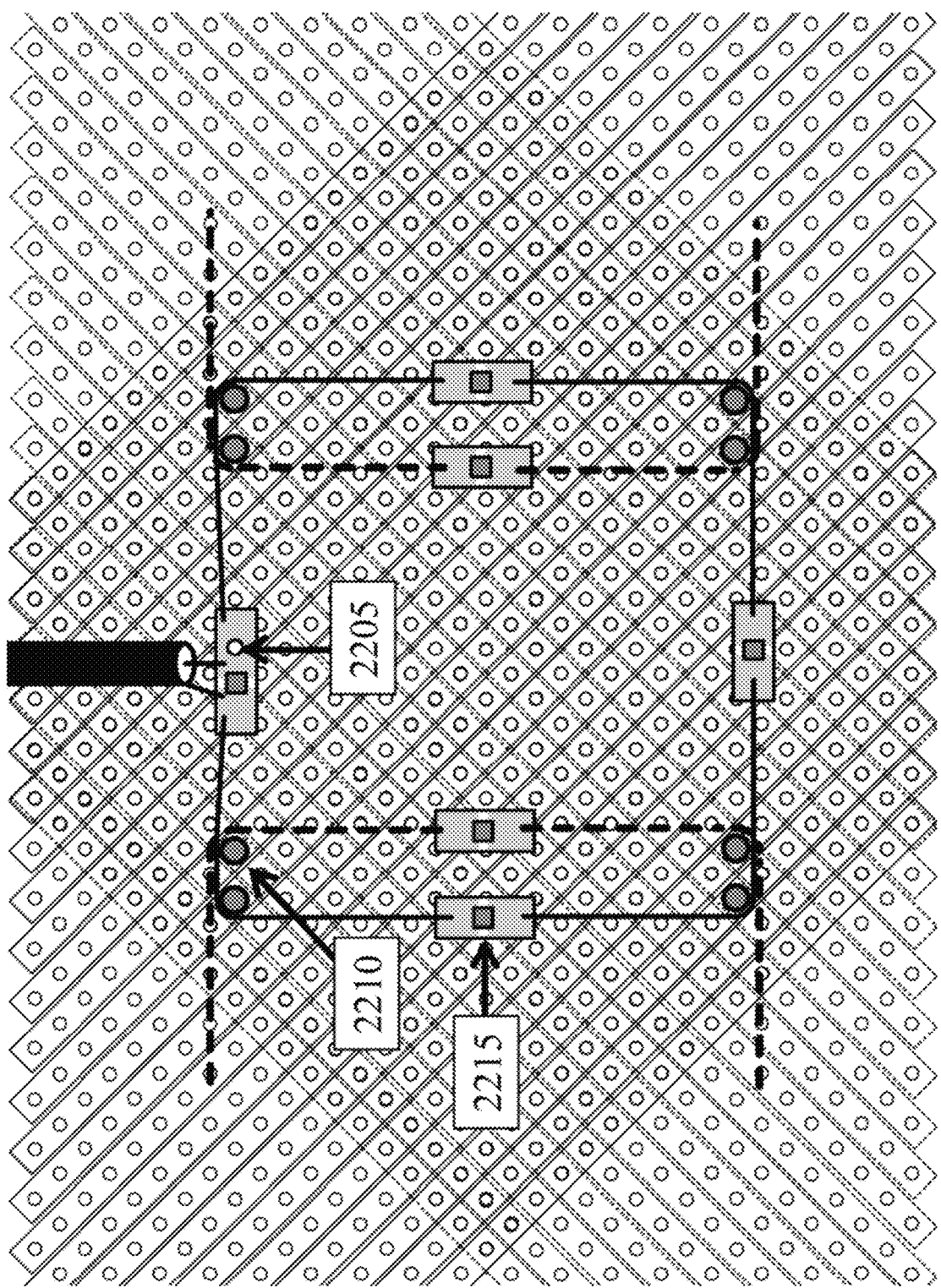
Figure 23:
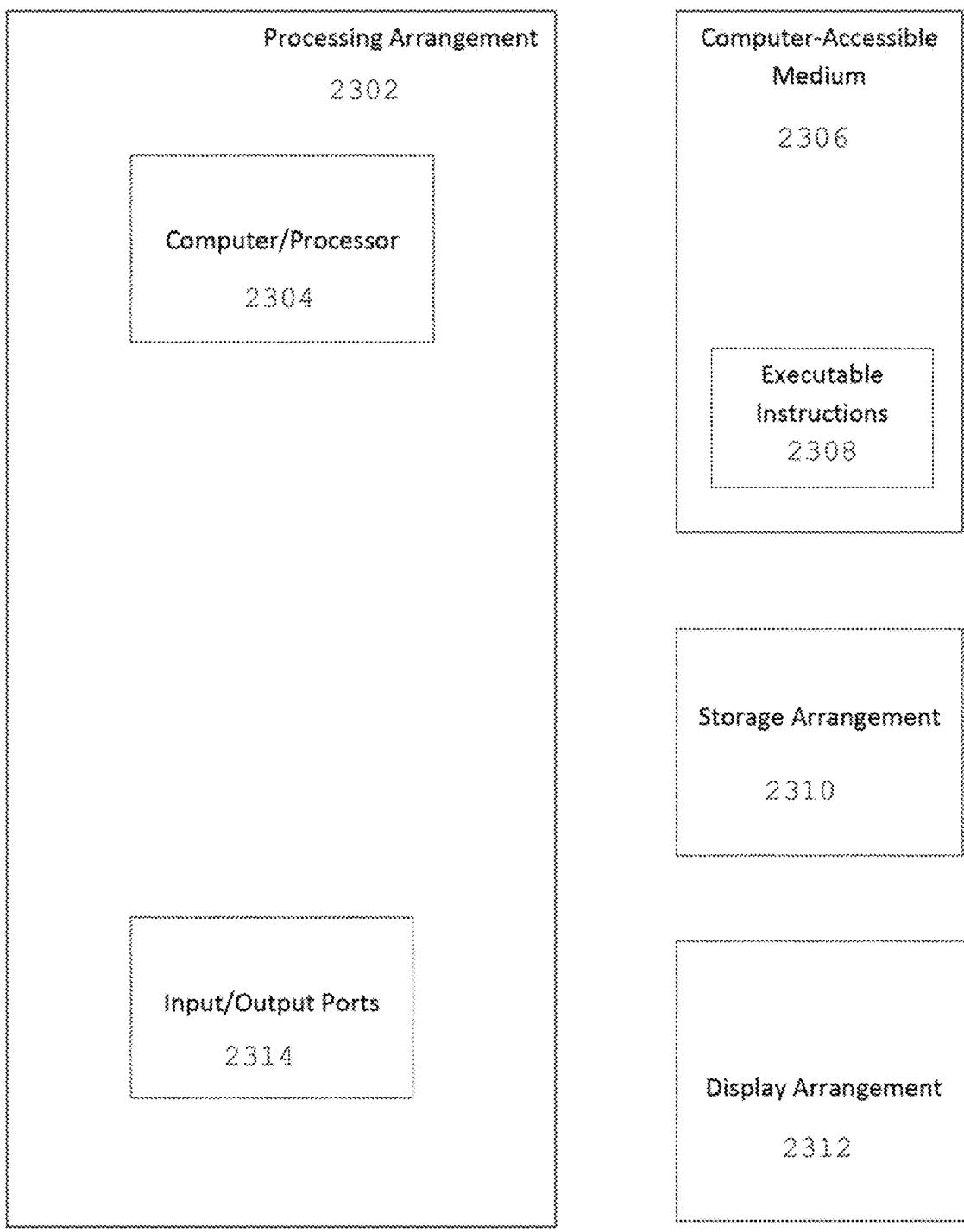

FIG. 19 is a set of diagrams of exemplary corner guides which can be used to constrain the position of the conductors as the exemplary RF coil array is stretched according to an exemplary embodiment of the present disclosure;

FIG. 20 is a set of images of substrates for the exemplary RF coil array illustrating corner guide structures which can constrain the positions of the wire conductors which make up the coil elements according to an exemplary embodiment of the present disclosure;

FIG. 21 is a set of diagrams of exemplary wire guide structures which can be placed along the length of the wire to constrain their position according to an exemplary embodiment of the present disclosure;

FIG. 22 is an exemplary diagram of the exemplary RF coil array according to an exemplary embodiment of the present disclosure; and FIG. 23 is an illustration of an exemplary block diagram of an exemplary system in accordance with certain exemplary embodiments of the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION OF EXEMPLARY EMBODIMENTS

A surface coil array that can stretch can facilitate optimal conformation to the human body. The exemplary coil arrangement, according to an exemplary embodiment of the present disclosure, can be based on a geometrical approach that can be based on a trellis-like lattice of interlinked slats which can facilitate a surface coil array to be re-shaped while maintaining coil tuning, coil loading, and decoupling of neighboring coils. The exemplary coil array can include, for example, a cylindrical array in which surface-coil elements of fixed circumference can morph or change as the array can be expanded such that there can be little change in tuning, match, or decoupling. An underlying trellis-like framework can control the coil element configuration. The exemplary coil arrangement can stretch such that a perimeter of a coil or a loop can be defined as the total length of the current path around the coil for conductors which are not deliberately formed into meandering paths.

Figure 1:
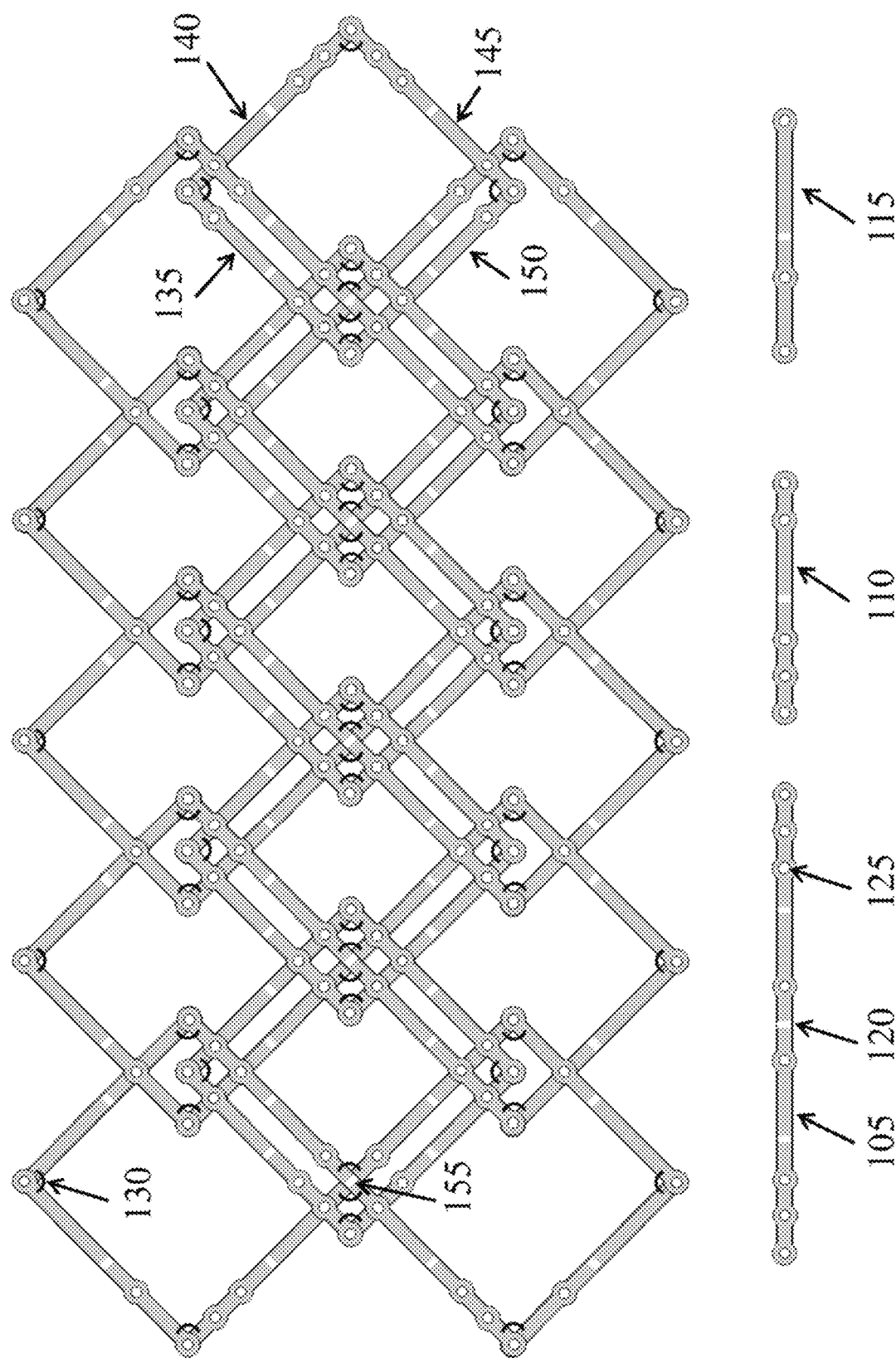
FIG. 1 is a set of exemplary diagrams of an exemplary RF coil array according to an exemplary embodiment of the present disclosure.

FIG. 1 shows a set of diagrams of an exemplary 15 element RF coil array constructed from rigid circuit board 105 material which can stretch in the left-right and/or the up-down directions to provide coverage for different-sized objects, according to an exemplary embodiment of the present disclosure. For example, three different structural elements 105, 110, and 115 can be used to construct the exemplary array. These exemplary elements can be manufactured, for example, from a copper coated circuit board. Gaps 120 in the copper can be provided to facilitate the inclusion of lumped element electrical components such as capacitors, inductors, or diodes in the circuit. Holes 125 in the circuit board can facilitate the different structural elements to be linked together using a linking element (e.g., a rivet or nut and bolt) so that the pieces pivot around the hole. Flexible wire sections 130 can be used to link the separate circuit board pieces together across the pivot point. A resonant RF surface coil loop can be formed, for example, from sections 135, 140, 145, and 150 when they can be linked together at the corners by wires. Capacitors can be soldered in at the gaps in the copper of the circuit board 120. Neighboring surface coil loops can be inductively decoupled by overlapping the structure. Surface coil loops in the top row can be decoupled from loops in the bottom row (e.g., capacitively) by virtue of the shared capacitor at 155.

Figure 2:
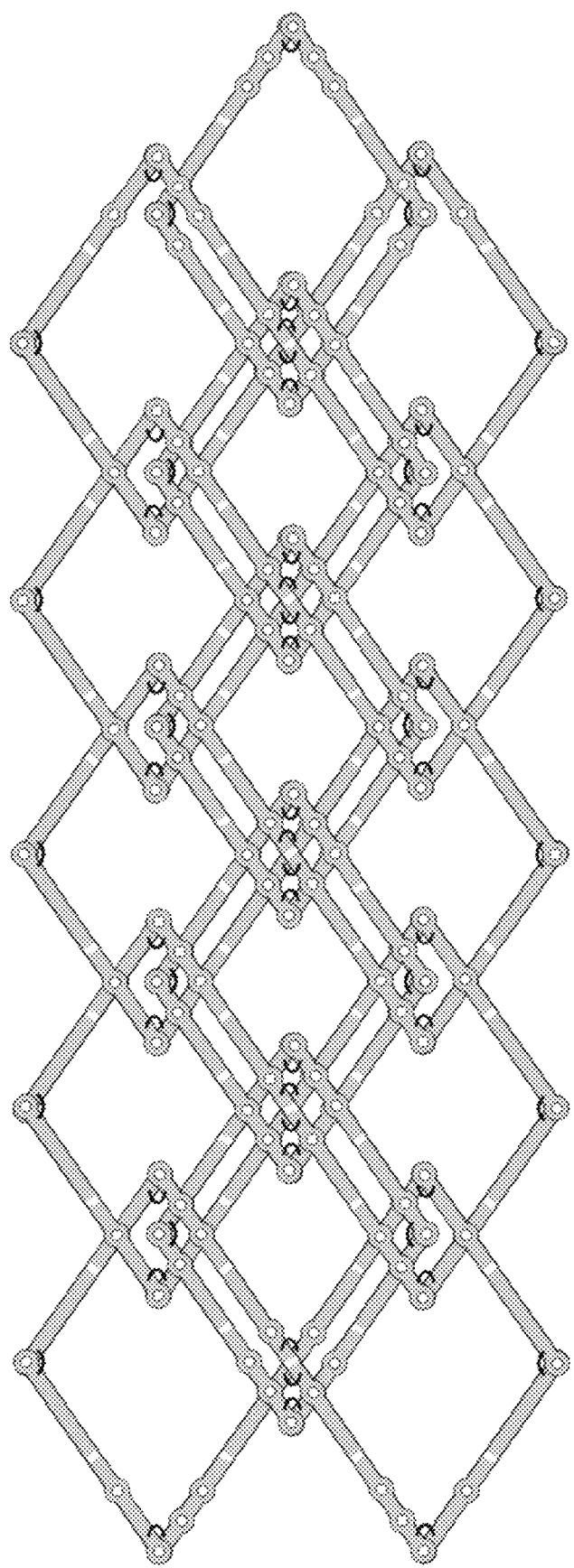
FIG. 2 is an exemplary diagram of the exemplary RF coil array from FIG. 1 stretched out in the left-right direction according to an exemplary embodiment of the present disclosure.

FIG. 2 shows a diagram of the exemplary 15 element RF coil array from FIG. 1 after it has been stretched in the left-right direction causing the various elements therein to pivot around their reflective pivot points according to an exemplary embodiment of the present disclosure.

Figure 3:
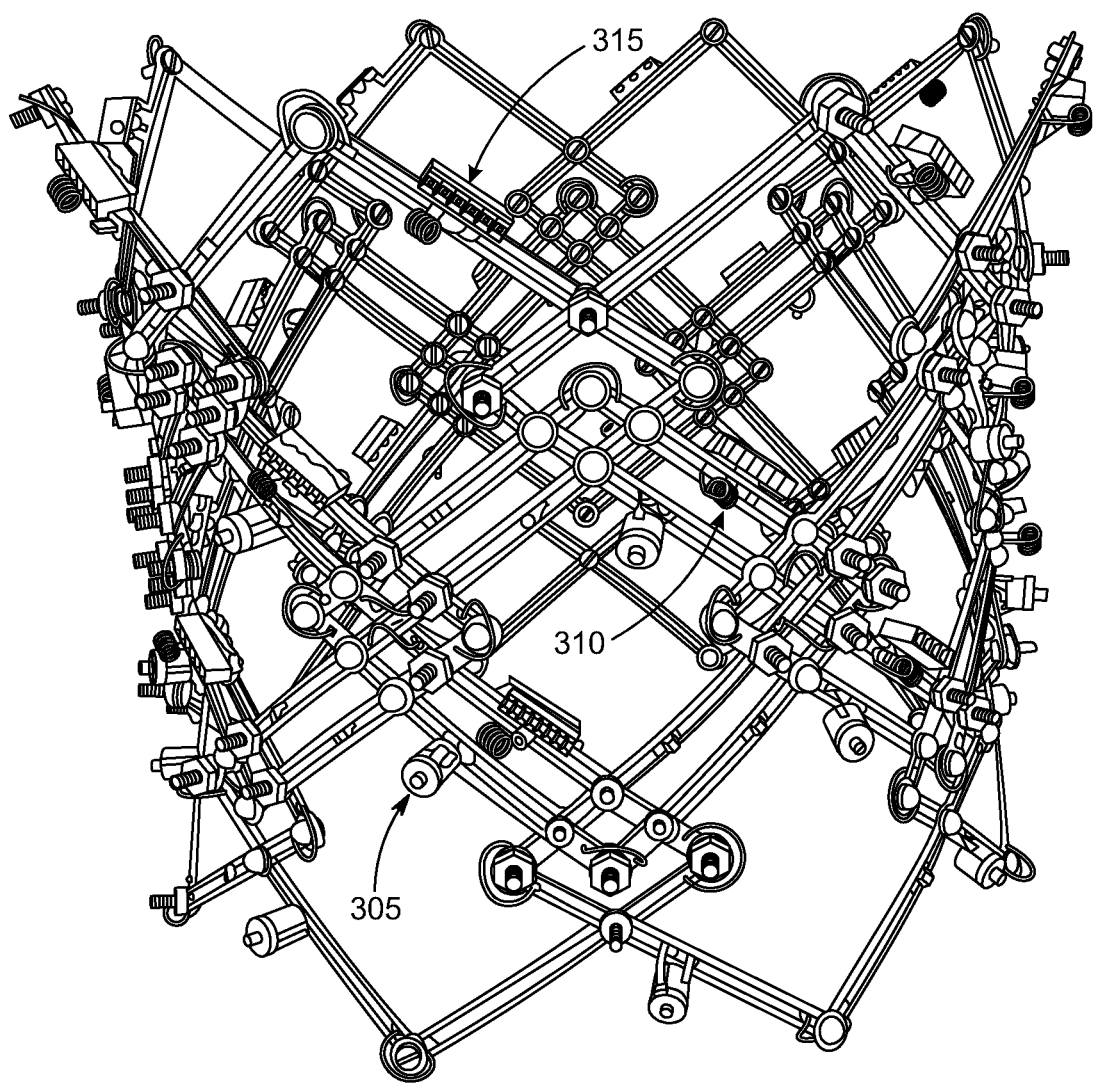
FIG. 3 is an image of an exemplary 24 element RF coil array according to an exemplary embodiment of the present disclosure.

FIG. 3 illustrates an image of an exemplary 24 element cylindrical RF coil array based on the RF coil array illustrated in FIG. 1 for use in knee imaging, according to an exemplary embodiment of the present disclosure. The diameter of the cylinder formed by the exemplary array can be expanded and contracted to fit snugly on knees of different sizes. An adjustable trimmer capacitor 305 can be used to tune the resonant frequency of the coil elements. A detuning circuit 310, which can include, for example, a capacitor, an inductor, and/or a diode, can be provided in each coil element to detune the coil element during the transmission of RF excitation pulses. Preamplifiers can be plugged into the sockets 315, and the signal can be communicated to the scanner using coaxial cables.

Figure 4:
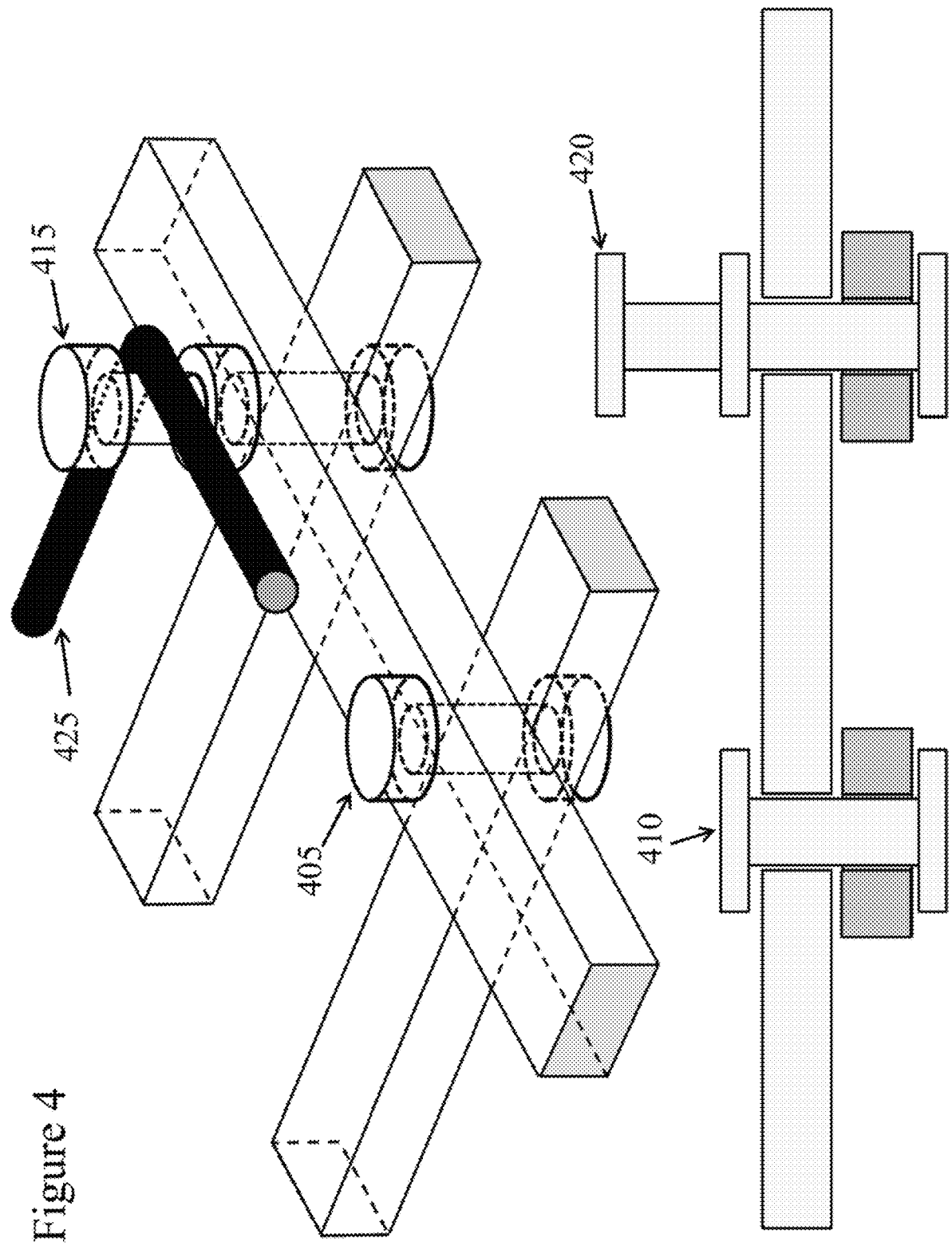
FIG. 4 is a perspective view of an exemplary diagram illustrating how structural elements of the exemplary array can be linked at pivot points, as well as wire guides that can be attached to the pivot structures according to an exemplary embodiment of the present disclosure.

FIG. 4 shows a perspective view of a diagram illustrating how structural elements of the exemplary array can be linked at pivot points, as well as wire guides that can be attached to the pivot structures. For example, as shown in FIG. 4, the exemplary mechanism by which slats, which cross each other, can be linked together at a pivot point by rivet-type structures 405 and 410. The rivet structures 405 and 410 can be extended to form a pulley or wire guides 415 and 420, and a flexible wire 425 can be pulled around to form a corner.

Figure 5A:
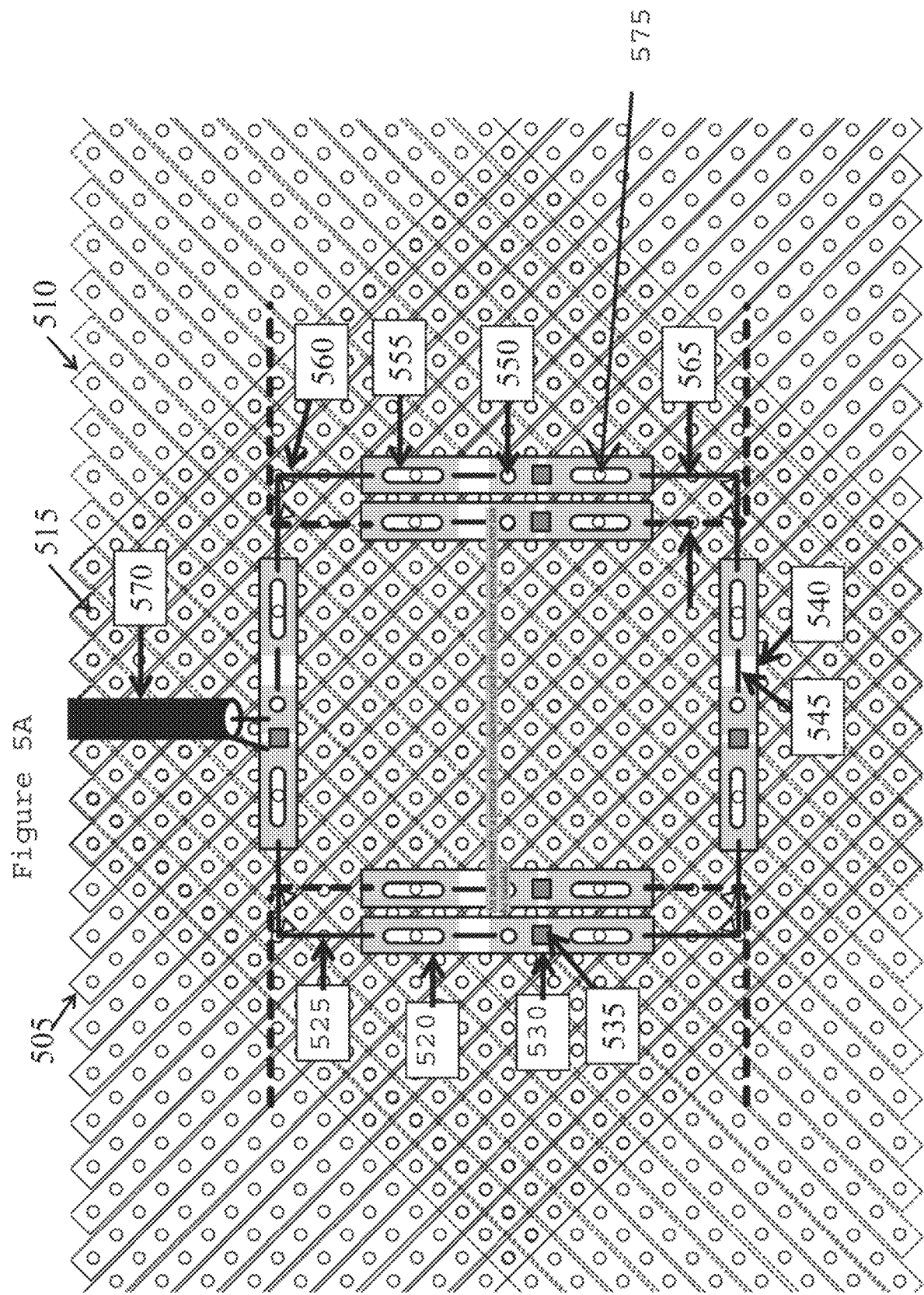
FIG. 5A is a schematic diagram of an exemplary RF coil element according to an exemplary embodiment of the present disclosure.

FIG. 5A shows a schematic diagram of an exemplary RF surface coil loop element mounted on a trellis-like substrate such that it can be stretched in the left-right and/or up-down directions. For example, the trellis substrate can be made of plastic that can include a set of parallel slats 505 in one direction overlaid with a set of parallel slats 510 oriented in another direction. The slats 505 and 510 can be linked together where they overlap by rivet-like structures linking holes in the slats 515. A surface coil loop element can be formed from a combination of circuit board elements 520 and flexible wire sections 525. The circuit board elements 520 can have gaps in the copper coating 530 where a capacitor 535 can be incorporated into the exemplary circuit.

Figure 5B:
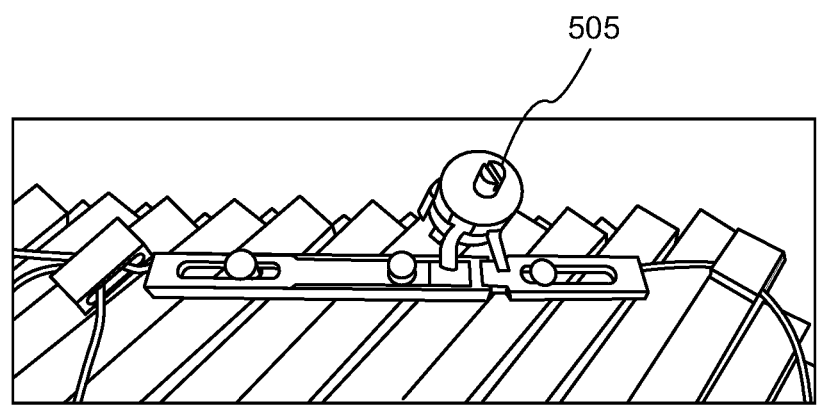
FIG. 5B is a close up view of the pins that attach the conductor to the substrate according to an exemplary embodiment of the present disclosure.
Figure 6:
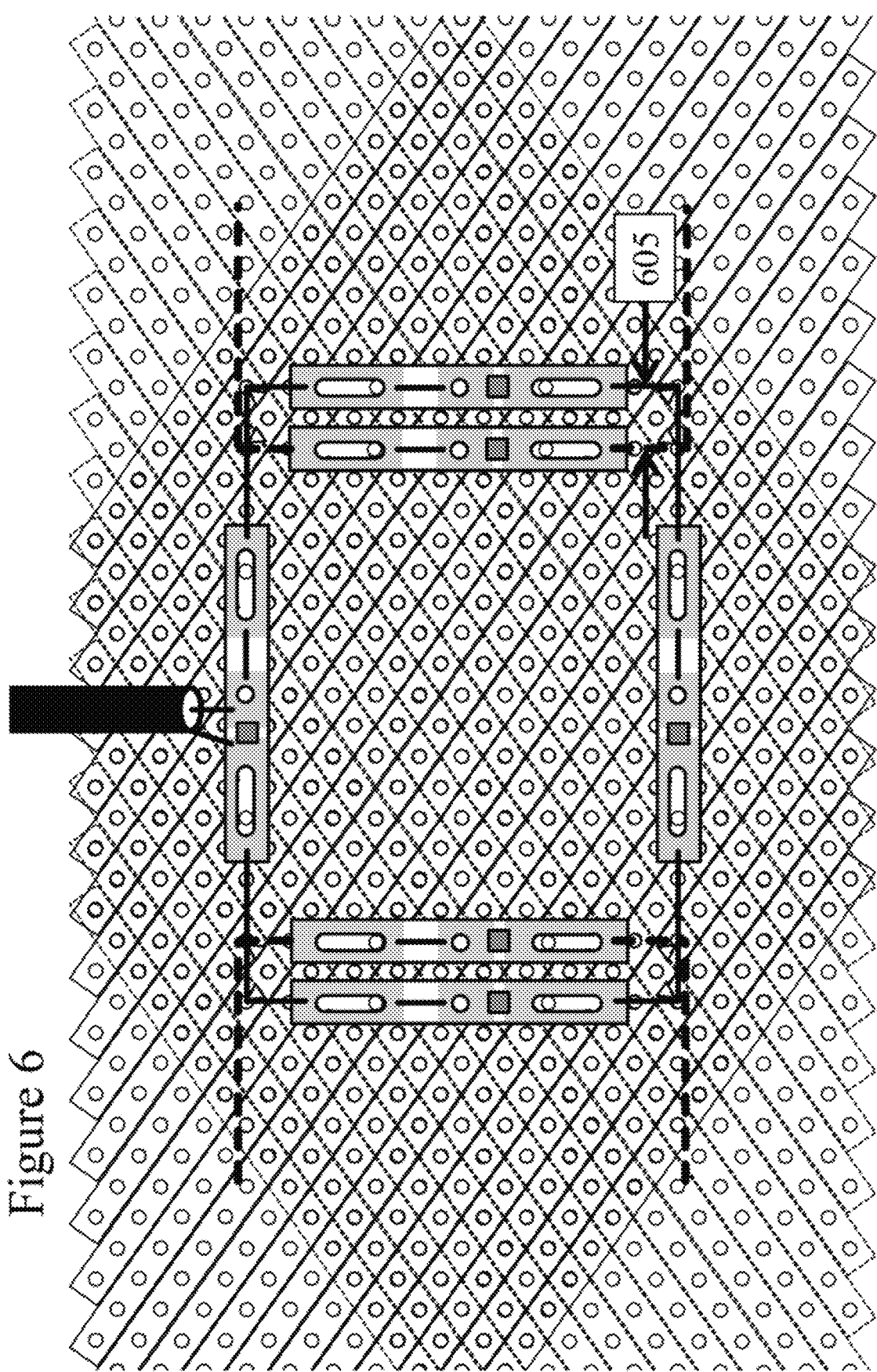
FIG. 6 is a schematic diagram of the exemplary RF coil element from FIG. 5A, which has been stretched in the left-right direction, according to an exemplary embodiment of the present disclosure.

As shown in FIG. 5A, an additional gap 540 in the copper can be provided which can be bridged by a wire jumper 545 whose position can be adjusted to optimize inductive decoupling of neighboring elements. Each circuit board element can have a hole 550, which can be used to pin it to the underlying trellis substrate with a rivet-like structure through a pivot point in the underlying lattice. Each circuit board element can have two slots 555 which can have a linking point 575 (e.g., a rivet-like structure or a pin) through them attached through a pivot point in the underlying lattice to locate the element with respect to the lattice, while facilitating the rivet-like structure to slide in the slot as the substrate can be stretched in one direction or another. The position of the flexible wire sections can be controlled by corner stays 560, which can protrude from the substrate (e.g., small triangles). Additional coil elements can be mounted on the trellis-like substrate such that they overlap by a particular amount to provide inductive decoupling 565. Signals can be transmitted from the coil element to a MRI scanner via a coaxial cable 570. FIG. 5B shows a close up view illustrating the one or more pins 505 that can pin the conductor to the substrate FIG. 6 illustrates a schematic diagram of the exemplary RF surface coil arrangement of FIG. 5A after the underlying trellis-like lattice has been stretched in the left-right direction, according to an exemplary embodiment of the present disclosure. As the loop becomes wider, the overlap 605 between neighboring coils can become larger, which can maintain decoupling of neighboring coils.

Figure 7A:
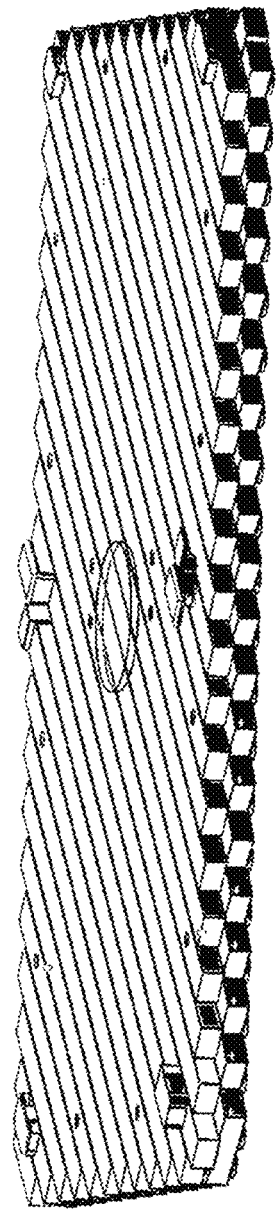
FIGS. 7A-7C are perspective views of the exemplary RF coil array substrate according to an exemplary embodiment of the present disclosure.
Figure 7B:
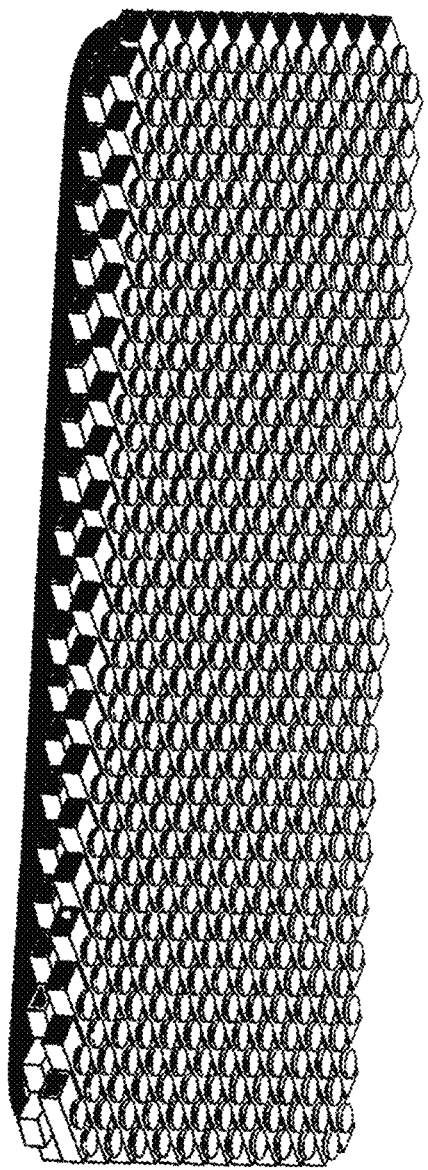
Figure 7C:
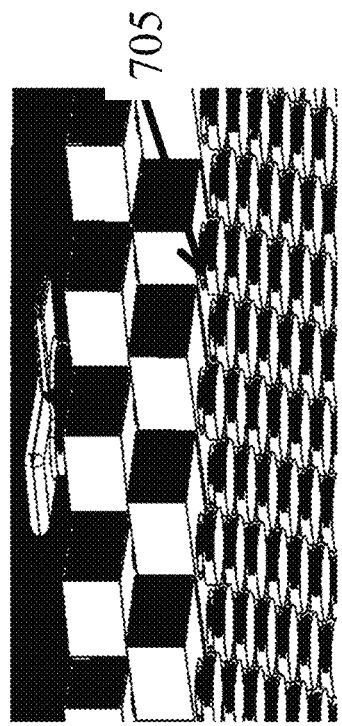

FIGS. 7A-7C show perspective views of the exemplary RF coil array substrate used for testing, according to an exemplary embodiment of the present disclosure. For example, FIG. 7A illustrates a top view of the exemplary coil array, FIG. 7B illustrates a bottom view of the exemplary coil array, and FIG. 7C illustrates a close-up view of the exemplary coil array. Rods 705 with caps can be seen in FIG. 7C, which can link the top surface slats to the bottom surface slats forming a trellis-like substrate. Holes for mounting pins and wire guides were incorporated in the exemplary design.

FIG. 8A shows a set of images illustrating the exemplary RF coil array for three different states of expansion. FIG. 8B shows a set of exemplary graphs illustrating S parameter measurements of the 2-element prototype at the three different stages of stretching according to an exemplary embodiment of the present disclosure. For example, coil elements were constructed out of circuit board segments and Teflon-coated multi-strand wire, with a suitable number of capacitors to bring the coils to resonance at about 123.2 MHz. Circuit boards were secured to the trellis with pins which can slide in slots to maintain the orientation of the boards. The coils were tuned and matched when placed about 1 cm above a body-sized tissue equivalent phantom (e.g., $\varepsilon r=40.5$, $\sigma=0.58$ S/m). Over the range of extensions of the coil, the coil tuning, match, and decoupling all remained stable as the array was stretched. S11 reflection can be less than −20 dB, and S21 coupling can be less than −13 dB. (See, e.g., graphs of FIG. 8B). The wires slid easily around the guides, and did not succumb to metal fatigue after several hundred extension and contraction cycles. The unloaded to loaded Q ratio for the surface coils was about 242/33=7.3 in all configurations. This compares to about 337/36=9.4 for a standard circuit board coil element of the same size. The coil circumference defined by the trellis did not stay constant as the array was flexed, which caused the wires to have slack for some extensions. This did not compromise decoupling over this exemplary range of extensions.

Figure 9B:
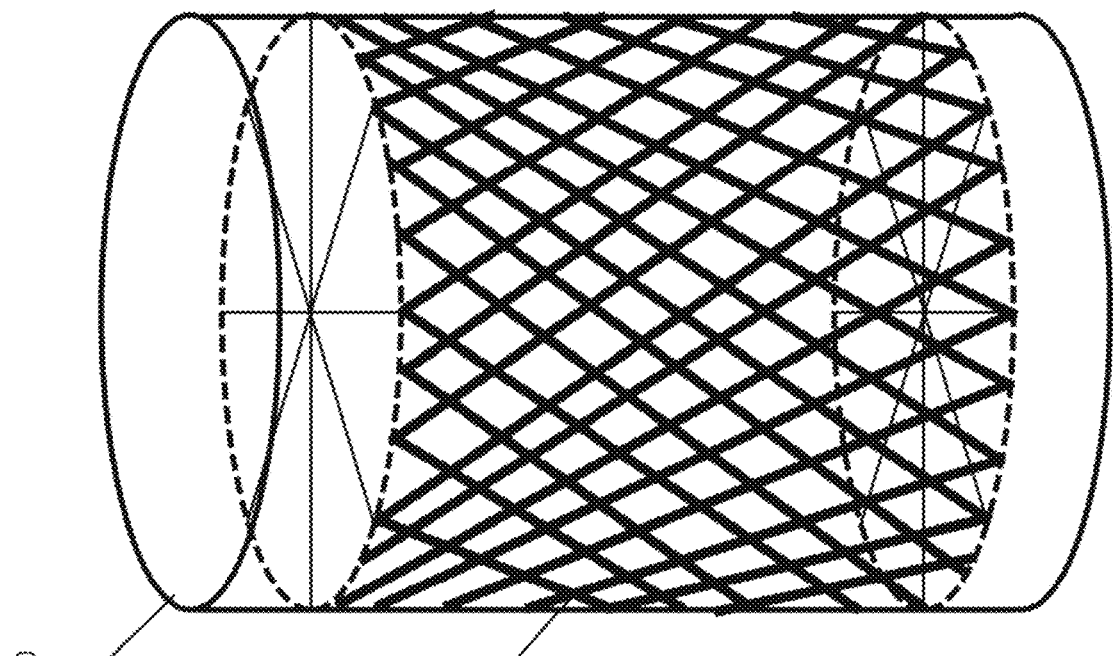
FIGS. 9A and 9B are diagrams of exemplary interlinked slats wrapped around cylinders having differing respective diameters according to an exemplary embodiment of the present disclosure.
Figure 9A:
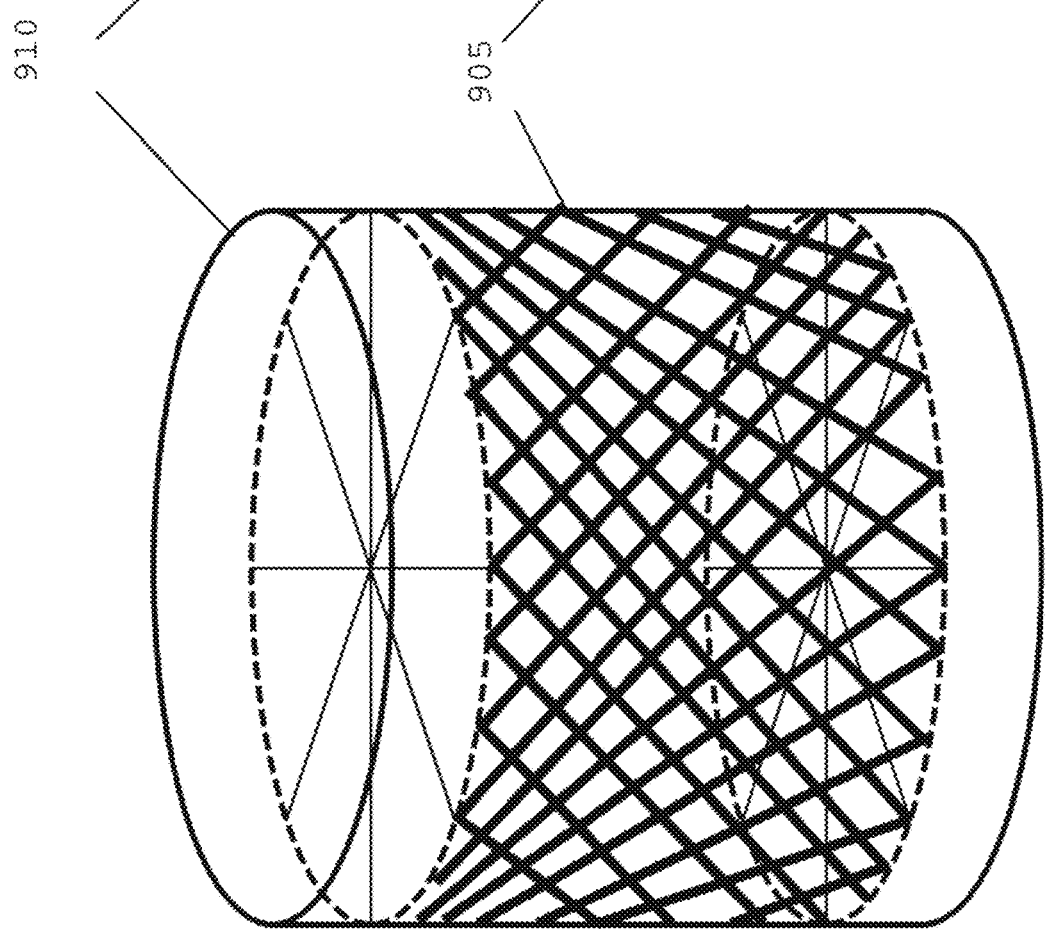

FIGS. 9A and 9B illustrate a set of diagrams showing how the trellis-like substrate 905 can be wrapped into a cylinder 910, which can change in diameter (e.g., diagram of FIG. 9A versus diagram of FIG. 9B) according to an exemplary embodiment of the present disclosure. The exemplary coil can be extended into cylindrical structures and multi-row arrays. Exemplary applications can include knee and extremity coils, body arrays, and pediatric coils. It can also be used to maintain the optimal distribution of electric dipole antennas around the torso for 7 T body arrays. (See e.g. Reference 5).

Figure 10:
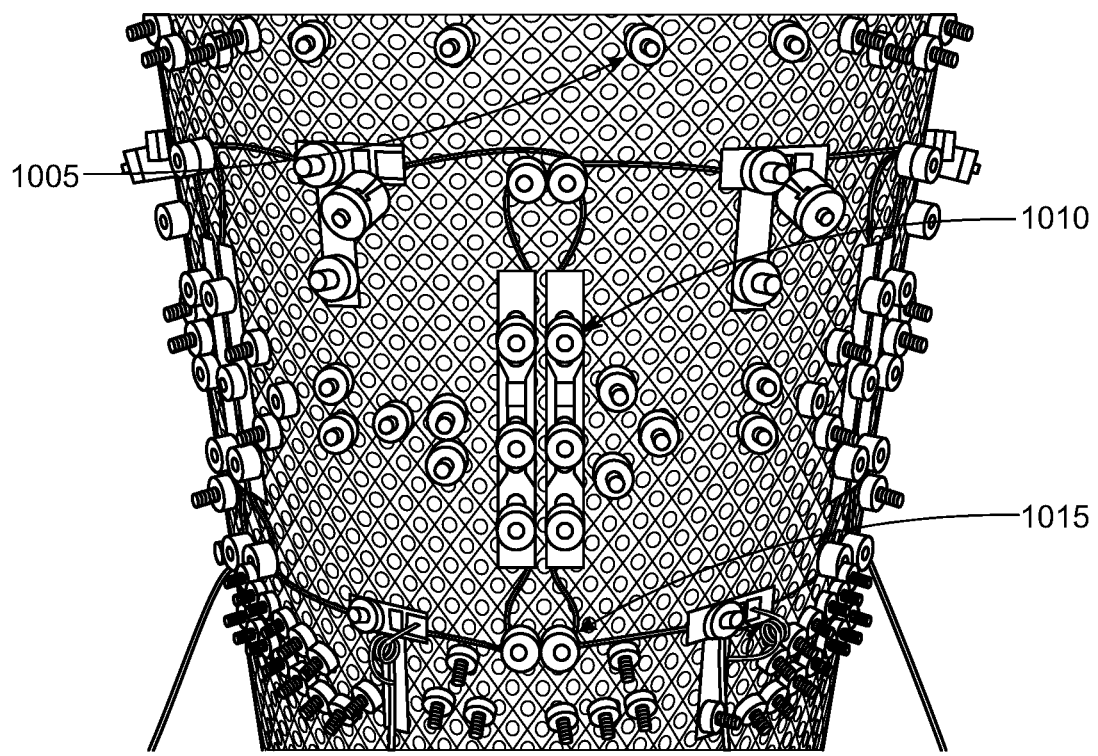
FIG. 10 is an image of an exemplary 8 element RF coil array according to an exemplary embodiment of the present disclosure.
Figure 11:
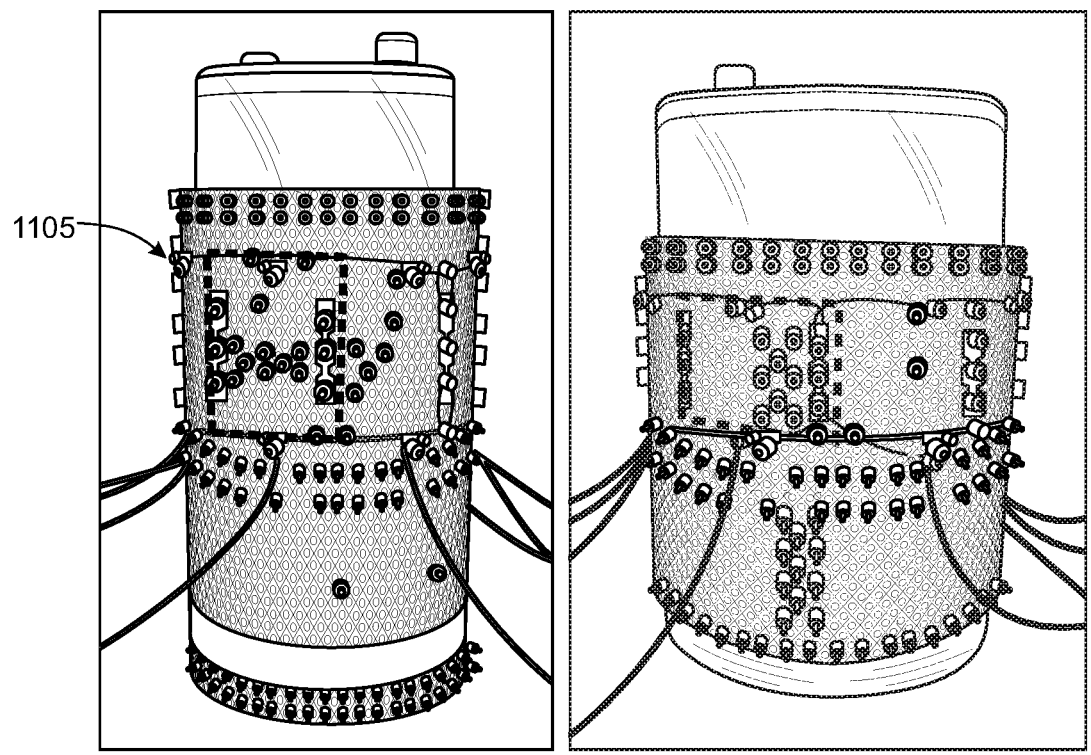
FIG. 11 is a set of images of the exemplary RF coil array from FIG. 10 having dotted lines to illustrate how the coil element shape can change as the RF coil array is reconfigured to conform to cylinders of different diameters according to an exemplary embodiment of the present disclosure.

FIG. 10 shows a close up image of an exemplary 8 element cylindrical RF coil array where the coil elements can be mounted on an underlying trellis-like substrate, according to an exemplary embodiment of the present disclosure. For example, nylon screws and/or nuts 1005 can be used to link the inner and outer layers of slats together, and can also be used to mount circuit board elements to the substrate 1010. Nylon screws and nuts 1005 can be used to guide the flexible wire sections at the corners of the coil elements 1015. Changing the angle between the strips in the two layers can facilitate the exemplary lattice to be stretched in one direction or the other. The lattice can be wrapped around to form a cylinder, and circuit-board components can be mounted on the lattice with a hole and slots such that the boards can ride on the lattice as it stretches. Multi-strand Teflon-coated wire can be used to link the circuit board elements, and can be pulled around screws located at the corners of the coil element to define the coil element shape. The use of about 10 strips per coil element can facilitate an about 10% overlap with neighboring coils for inductive decoupling. The lattice can expand in diameter from about 14.5 cm to about 20.5 cm, morphing the coils from about 6.5×9.5 cm to about 9.5×6.5 cm in the process. (See e.g., exemplary images shown in FIG. 11). Each element can be tuned to about 123.2 MHz with about 4 capacitors, and can have an active detuning trap. The coils were interfaced to the scanner through an in-house built 8 channel interface. The array was evaluated on three cylindrical phantoms with $\varepsilon_r=56.6$, $\sigma=0.37$ S/m with diameters of about 13.4 cm, about 16.5 cm and about 19.5 cm. It was also compared to a commercially available 15 channel knee coil (e.g., QED, Mayfield Village, Ohio). FIG. 11 shows a set of images illustrating how the shape of the coil elements can change (e.g., element 1105) as the cylindrical substrate diameter can be changed.

Figure 12:
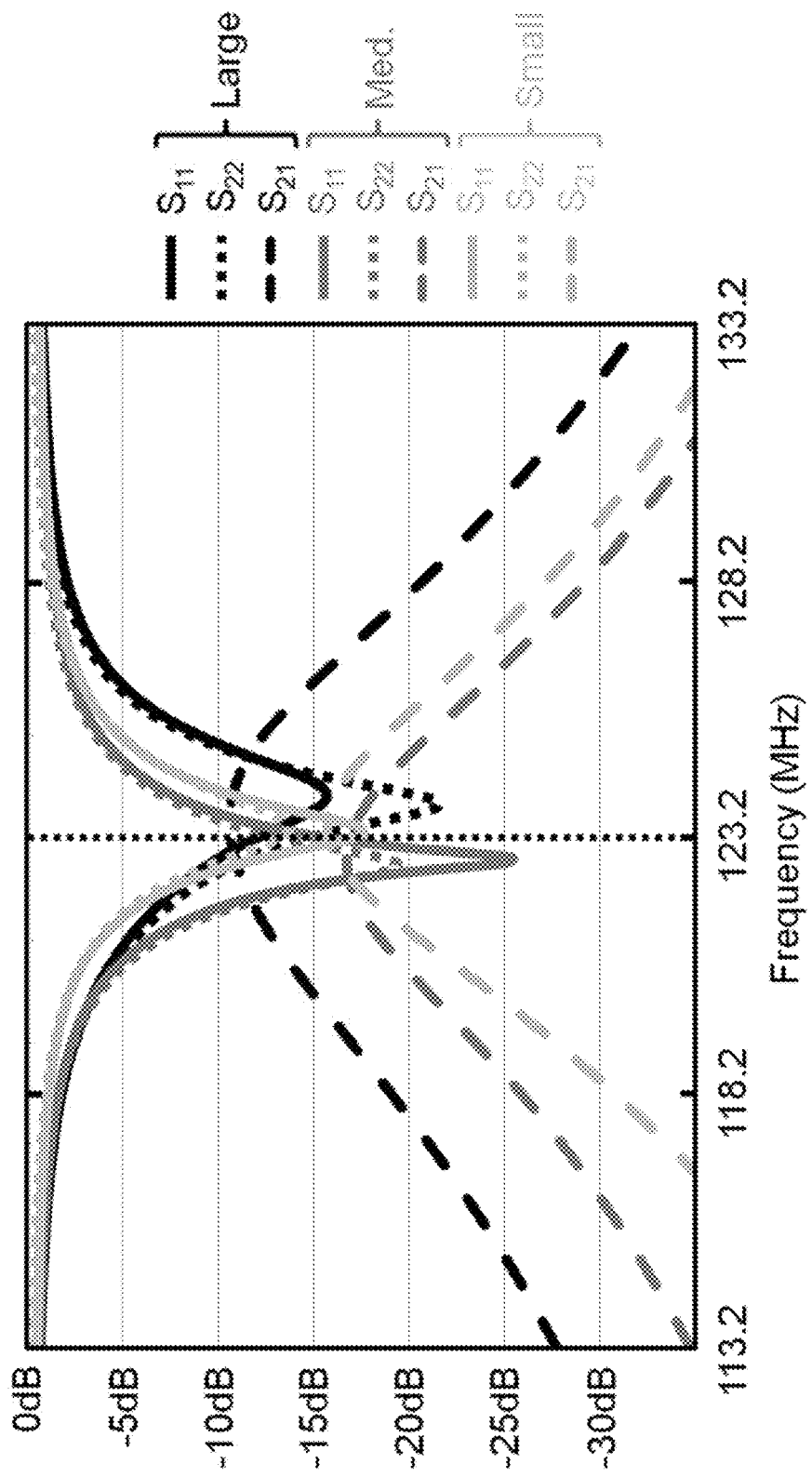
FIG. 12 is a diagram illustrating S11 and S22 reflections for two elements in the exemplary 8 channel cylindrical RF coil array of FIG. 10 and exemplary S21 coupling between such two elements when the RF coil array is reconfigured to fit cylindrical phantoms of three different diameters according to an exemplary embodiment of the present disclosure.

FIG. 12 illustrates a graph of S-parameter measurements for a pair of neighboring coil elements on the exemplary 8 channel cylindrical array as the array can be mounted snugly on cylindrical phantoms of three different diameters, according to an exemplary embodiment of the present disclosure. S11 reflection can be less than about −13 dB and S21 coupling can be less than about −11 dB. The unloaded-to-loaded Q ratio was about 230/35 for the large phantom, dropping to about 230/50 on the small phantom. A conventional circuit-board coil element of the same size had an unloaded Q of about 337. The elements of the exemplary 8 channel array were tuned and matched, and decoupling was adjusted by moving a wire jumper on the circuit boards. Once this was set, no adjustments were made to the array as it was placed on the different sized phantoms. S-parameter plots for a pair of coils are shown in FIG. 12. Coil tuning, match and decoupling all remain within acceptable limits as the array can be stretched and the coil elements morph to different shapes. Exemplary worst case S11 and S21 can be about −12 dB and about −10.7 dB respectively.

Figure 13:
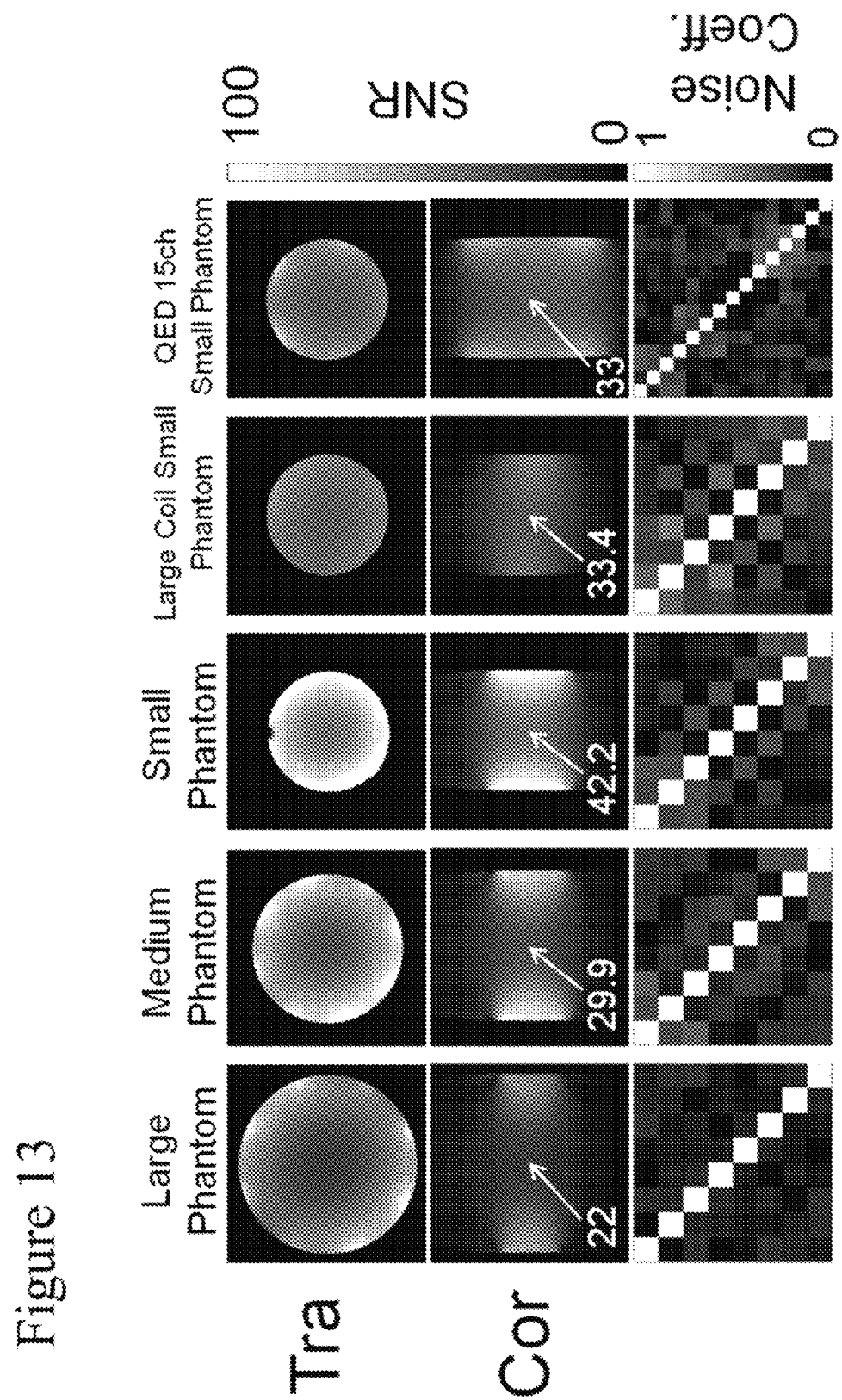
FIG. 13 is a set of Signal-to-Noise Ratio maps and noise correlation coefficient matrices obtained using the exemplary 8 channel cylindrical RF coil array according to an exemplary embodiment of the present disclosure.

FIG. 13 shows a set of signal-to-noise ratio ("SNR") maps for sum of squares reconstruction and noise correlation coefficient matrices obtained with the exemplary 8 element cylindrical RF coil array, according to an exemplary embodiment of the present disclosure. For example, the coil array can be mounted on phantoms of different diameters, and adjusted to fit snugly on each phantom. SNR can be much higher when the array can be mounted snugly on the small phantom. Then, the small phantom can be placed in the array, but the array can be left at the largest diameter, illustrating the benefit of adapting the exemplary array to the size of the object being imaged. Data is also shown for a commercially available 15 channel knee coil (e.g., QED 15 ch).

FIG. 14A shows a schematic diagram of exemplary electric dipole antennas 1405 distributed on an interlinked lattice 1410 according to an exemplary embodiment of the present disclosure. For example, FIG. 14A illustrates how a number of electric dipole antennas can be mounted on a trellis-like substrate such that they can always be parallel to each other, and can have the same distance between them. A schematic of the electric dipole antenna is shown in FIG. 14B.

Figure 15A:
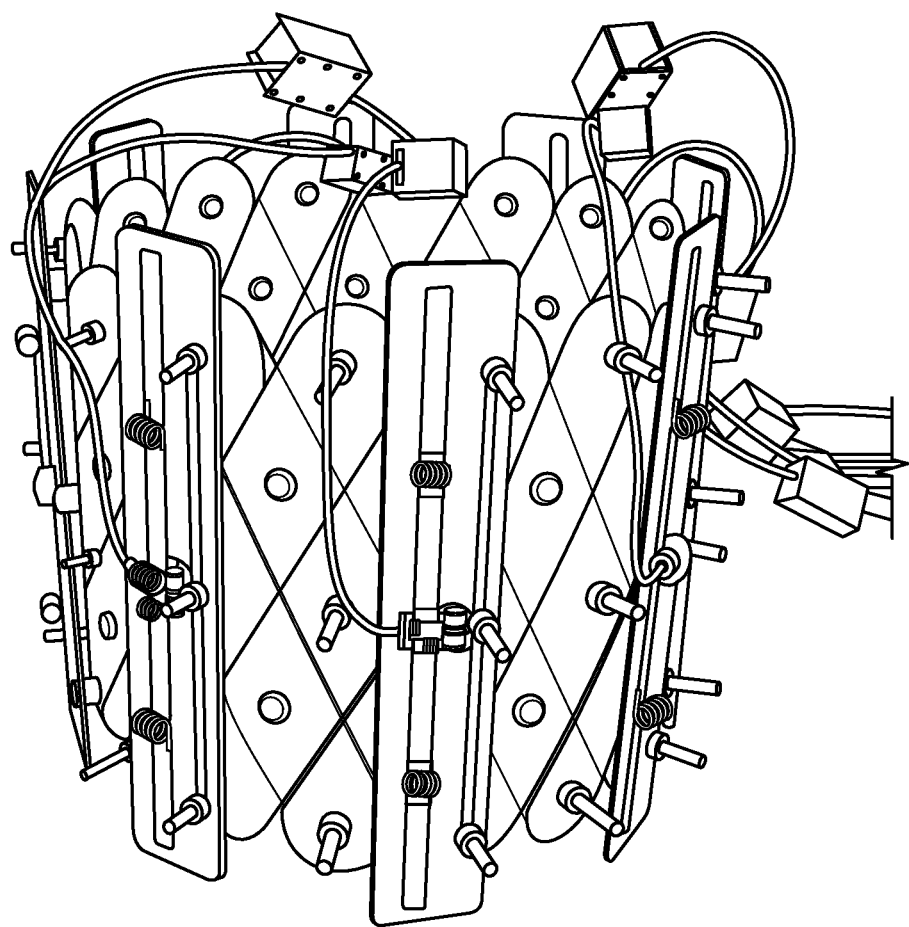
FIGS. 15A and 15B is a set of images of an exemplary 8 channel electric dipole antenna array shown in two different states of expansion according to an exemplary embodiment of the present disclosure.
Figure 15B:
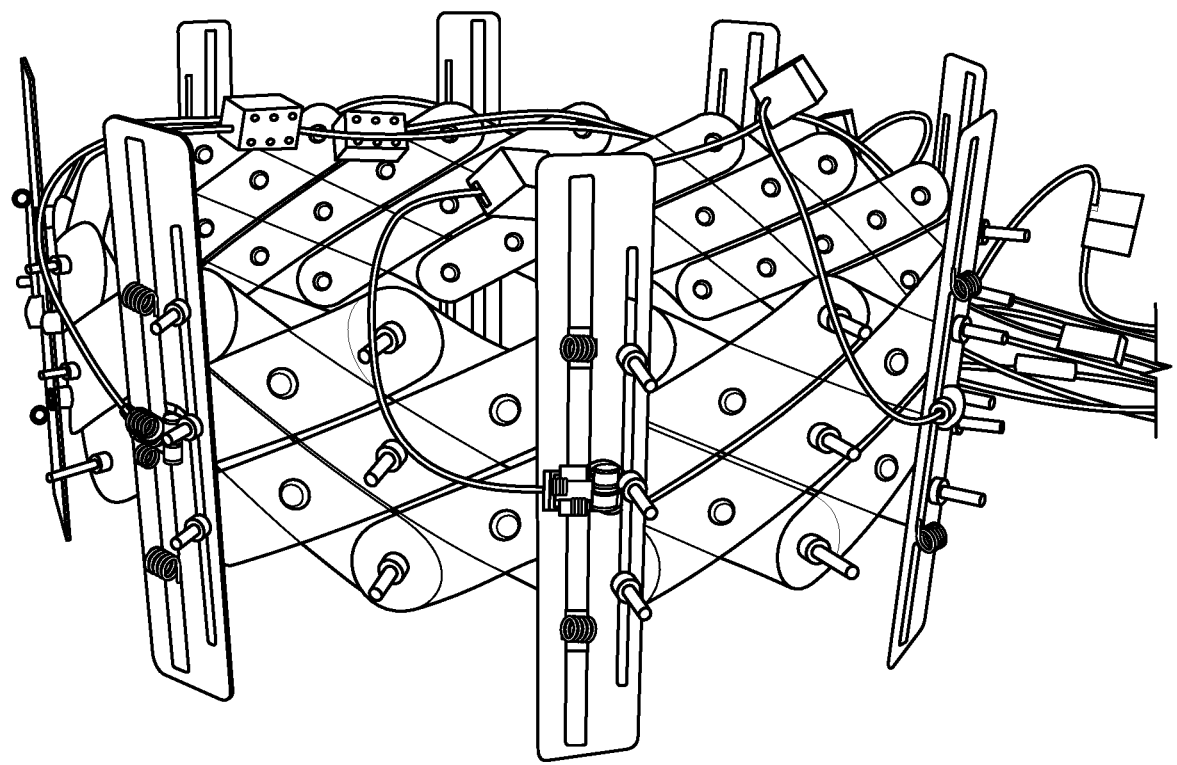

FIGS. 15A and 15B show exemplary images of an exemplary 8 channel transmit-receive electric dipole antenna array for 7 Tesla mounted on a trellis-like substrate. The array can be made smaller (e.g., the image of FIG. 15A) or larger (e.g., the image of FIG. 15B) while maintaining an equal spacing between the antennas, and ensuring that the antennas remain parallel to each other.

Figure 16:
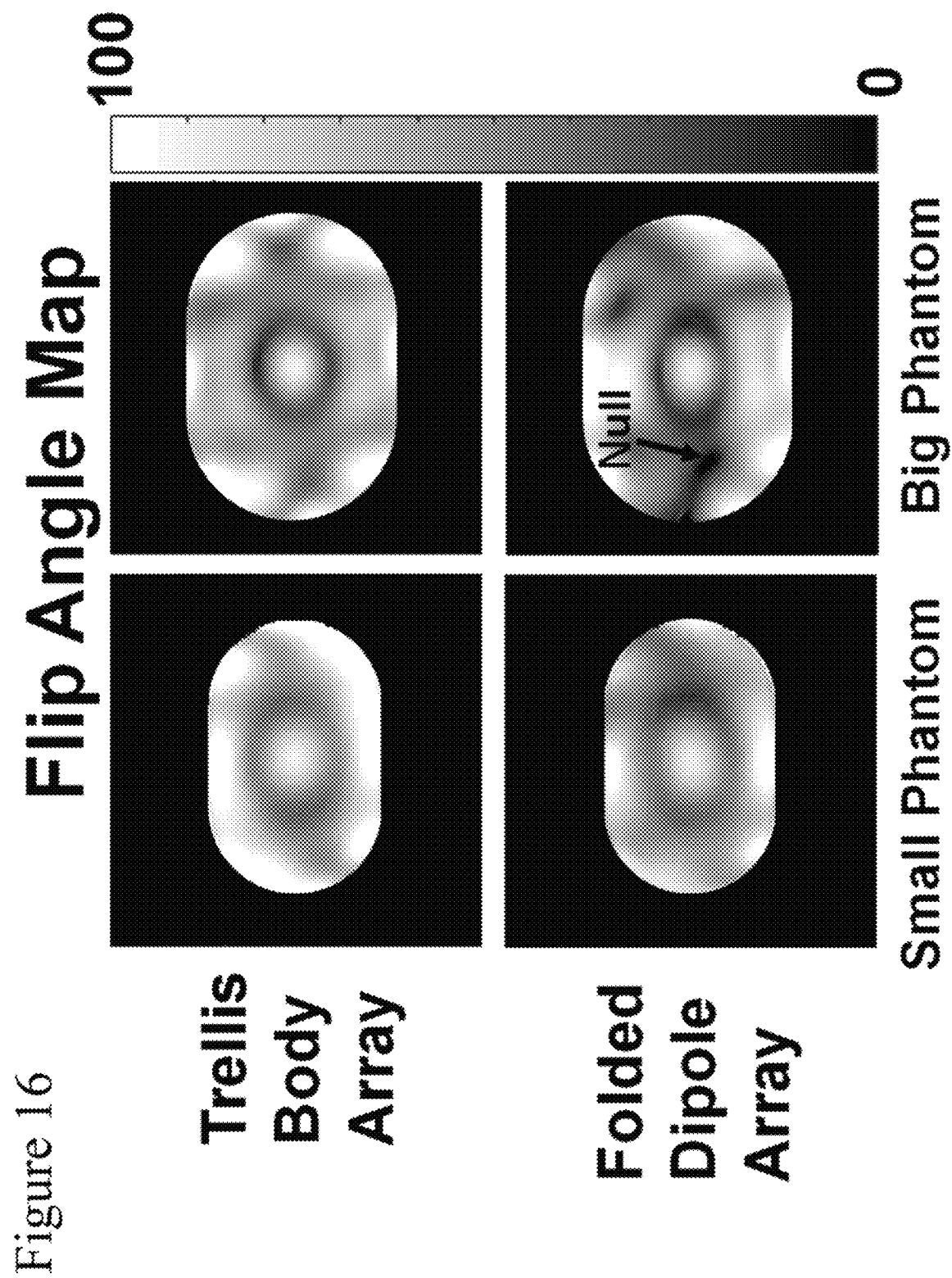
FIG. 16 is a set of B1+ maps obtained using the exemplary 8 channel electric dipole antenna array for a Trellis Body Array and with an electric dipole antenna array with fixed inter-element spacing for a Folded Dipole Array according to an exemplary embodiment of the present disclosure.

FIG. 16 shows a set of Flip Angle maps obtained using the exemplary 8 channel transmit-receive electric dipole antenna array with trellis-like substrate (e.g., Trellis Body Array) and an exemplary 8 channel electric dipole antenna array with fixed inter-element spacing (e.g., Folded Dipole Array). With the small phantom, both arrays perform well, but on the large phantom, the folded dipole array shows a prominent null in the flip angle map caused by the uneven spacing of the elements.

Figure 17:
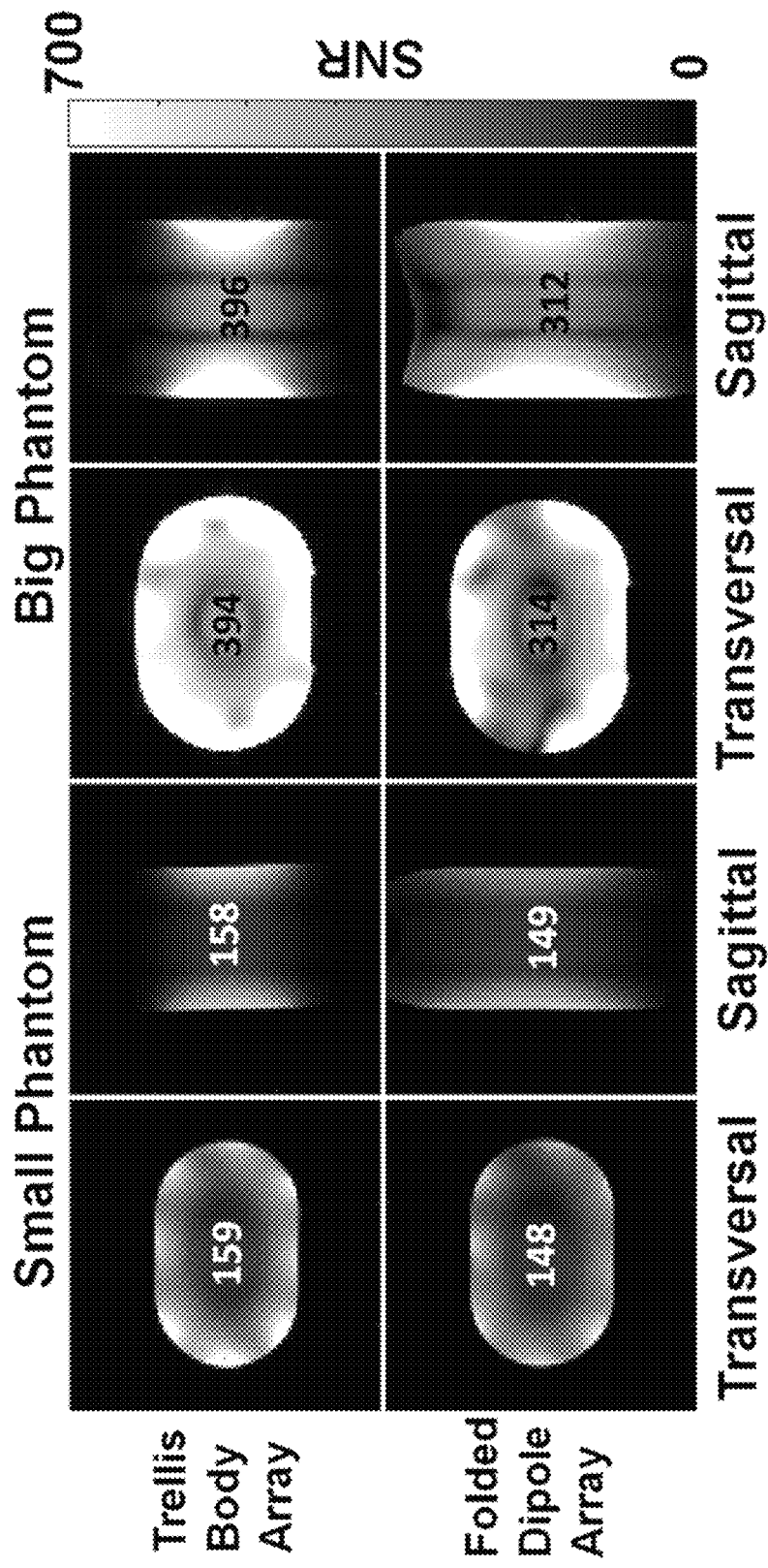
FIG. 17 is a set of Signal-to-Noise Ratio maps obtained using the exemplary 8 channel electric dipole antenna array with an electric dipole array having a fixed inter-element spacing on small and large phantoms according to an exemplary embodiment of the present disclosure.

FIG. 17 shows a set of SNR maps for the exemplary 8 channel transmit-receive electric dipole antenna array with trellis-like substrate (e.g., Trellis Body Array) and an exemplary 8 channel electric dipole antenna array with fixed inter-element spacing (e.g., Folded Dipole Array).

Figure 18:
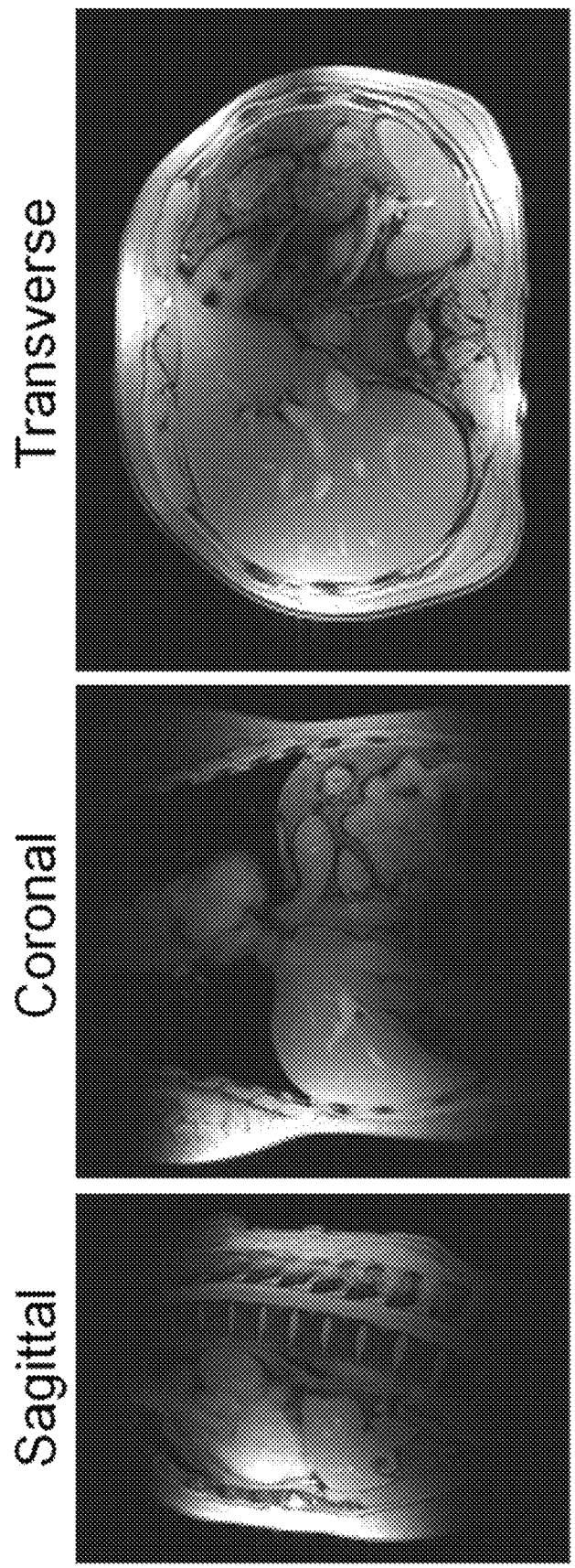
FIG. 18 is a set of magnetic resonance imaging images of the human body obtained at 7 Tesla using the exemplary 8 channel electric dipole antenna array according to an exemplary embodiment of the present disclosure.

FIG. 18 illustrates a set of MRI images of a human torso obtained at 7 Tesla using the exemplary 8 channel transmit-receive electric dipole antenna array with trellis-like substrate according to an exemplary embodiment of the present disclosure.

FIG. 19 shows a set of diagrams of triangle-shaped corner stays 1905 which can protrude out of the trellis-like substrate, and control the position of the flexible wire 1910, which can be pulled around them. The corner stays are shown at three different degrees of stretching of the underlying substrate. (See e.g., elements 1917, 1920, and 1925).

FIG. 20 illustrates a top view of the substrate for the exemplary stretchable RF coil array with a trellis-like substrate, according to an exemplary embodiment of the present disclosure. As shown in FIG. 20, corner stays 2005 can be used and/or included, having caps thereon, which can be used to hold flexible wires in place.

FIG. 21 shows a set of diagrams of exemplary wire guides 2105 which can be raised sections in the trellis-like substrate, and which can maintain the position of the wires 2110, according to an exemplary embodiment of the present disclosure.

FIG. 22 illustrates an exemplary diagram of the RF surface coil loop element mounted on a trellis-like substrate shown in FIG. 5A. For example, one circuit board element has a hole in it 2205 which can facilitate it to be pinned to the underlying trellis-like substrate with a rivet-like device. Wires can be guided by being wrapped around posts 2210 protruding from the rivet-like structures, which link the top and bottom slats together, also shown in FIG. 4. Another circuit board piece 2215 may not be pinned to the substrate, but can be facilitated to float with their position determined only by the tension on the flexible wires which join them.

FIG. 23 shows a block diagram of an exemplary embodiment of a system according to the present disclosure. For example, exemplary procedures in accordance with the present disclosure described herein can be performed by a processing arrangement and/or a computing arrangement 2302. Such processing/computing arrangement 2302 can be, for example entirely or a part of, or include, but not limited to, a computer/processor 2304 that can include, for example one or more microprocessors, and use instructions stored on a computer-accessible medium (e.g., RAM, ROM, hard drive, or other storage device).

As shown in FIG. 23, for example a computer-accessible medium 2306 (e.g., as described herein above, a storage device such as a hard disk, floppy disk, memory stick, CD-ROM, RAM, ROM, etc., or a collection thereof) can be provided (e.g., in communication with the processing arrangement 2302). The computer-accessible medium 2306 can contain executable instructions 2308 thereon. In addition or alternatively, a storage arrangement 2310 can be provided separately from the computer-accessible medium 2306, which can provide the instructions to the processing arrangement 2302 so as to configure the processing arrangement to execute certain exemplary procedures, processes, and methods, as described herein above, for example.

Further, the exemplary processing arrangement 2302 can be provided with or include an input/output arrangement 2314, which can include, for example a wired network, a wireless network, the internet, an intranet, a data collection probe, a sensor, etc. As shown in FIG. 23, the exemplary processing arrangement 2302 can be in communication with an exemplary display arrangement 2312, which, according to certain exemplary embodiments of the present disclosure, can be a touch-screen configured for inputting information to the processing arrangement in addition to outputting information from the processing arrangement, for example. Further, the exemplary display 2312 and/or a storage arrangement 2310 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY REFERENCES

The following references are hereby incorporated by reference in their entireties:
[1] Nordmeyer-Massner J Magnetic Resonance in Medicine 61:429-438 (2009)
[2] Nordmeyer-Massner J, Magnetic Resonance in Medicine 67:872-879 (2012)
[3] Adriany G, Magnetic Resonance in Medicine 59:590-597 (2008)
[4] Wiggins ISMRM 2016 p. 493
[5] Zhang B, Proc. ISMRM 2016 p. 6101

[6] Lee, W. Proc. ISMRM 21(2013), p 0292;
[7] Raaijmakers, A. Magn. Reson. Med (2015) Early View doi:10.1002/mrm.25596;
[8] Stephan Orzada, et al, Med. Phy. 37, 2225(2010);
[9] Wiggins G, Proc. ISMRM 2016 p. 3502.
[10] Klose U, Med. Phys. 19 (4), 1992
[11] Orzada S, Magn. Reson. Med 64(2):327-33 (2010)

What is claimed is:

1. A coil arrangement comprising:
at least one loop comprising:
 a plurality of first conductors extending in a first direction;
 a plurality of second conductors extending in a second direction, wherein the first direction is different from the second direction;
 a plurality of first linking points linking the first conductors to the second conductors, and
 a plurality of second linking points linking the first conductors and the second conductors to a substrate, wherein the substrate is a trellis structure that includes a lattice structure having a plurality of linked slats,
wherein the at least one loop is configured to stretch in a third direction, and wherein a perimeter of the at least one loop is constant.

2. The coil arrangement of claim 1, wherein the third direction is different from the first and second directions.

3. The coil arrangement of claim 1, wherein the third direction is the same as at least one of the first direction or the second direction.

4. The coil arrangement of claim 1, wherein the first linking points at least one of (i) mechanically and pivotally connect the first conductors to the second conductors, (ii) include flexible conductors, or (iii) include at least one of a slot or a hole.

5. The coil arrangement of claim 1, wherein the lattice structure includes a plurality of spaced apart parallel strips of material that are laid in two layers, wherein the parallel strips of a first layer of the layers is oriented at an angle greater than 5 degrees and less than 85 degrees from the parallel strips of a second layer of the layers, and wherein the first layer and the second layer are connected to each other using a plurality of crossing points that facilitate a change in an angle between the parallel strips of the first layer and the parallel strips of the second layer.

6. The coil arrangement of claim 5, wherein the crossing points are at least one of rivets or hinges.

7. The coil arrangement of claim 1, wherein the lattice structure at least one of (i) includes at least 10 equally spaced strips across a width of the at least one loop, (ii) includes a plurality of strips, and wherein an angle between the strips is approximately 90 degrees, or (iii) is shaped as a cylinder.

8. The coil arrangement of claim 1, further comprising a plurality of further loops, each of the further loops comprising:
 a plurality of third conductors extending in the first direction;
 a plurality of fourth conductors extending in the second direction; and
 a plurality of third linking points linking the third conductors to the fourth conductors
wherein the further loops are configured to stretch in the third direction.

9. The coil arrangement of claim 8, wherein the at least one loop and one of the further loops at least one of (i) overlap, (ii) form at least one row of loops around a cylinder, (iii) are configured to null a mutual inductance of the at least one loop and the at least one of the further loops, or (iv) each forms a parallelogram.

10. The coil arrangement of claim 1, further comprising a radio frequency (RF) arrangement configured to at least one of (i) generate at least one first RF signal to be transmitted by the coil arrangement or (ii) receive at least one second RF signal using the coil arrangement.

11. The coil arrangement of claim 1, wherein:
the first conductors include two parallel first conductors,
the second conductors include two parallel second conductors,
a first one of the two parallel first conductors is connected to a first one of the two parallel second conductors by a first flexible conductor,
a second one of the two parallel first conductors is connected to the first one of the two parallel second conductors by a second flexible conductor,
a second one of the two parallel second conductors is connected to the second one of the two parallel first conductors by a third flexible conductor, and
the first one of the two parallel first conductors is connected to the second one of the two parallel second conductors by a fourth flexible conductor.

12. The coil arrangement of claim 1, wherein an angle formed by a particular first conductor overlaid with a particular second conductor can be variable.

13. A coil arrangement comprising:
a base portion having an adjustable shape;
at least two first conductors oriented in a first direction;
at least two second conductors oriented in a second direction, wherein the second direction is different from the first direction;
at least two connecting conductors, one of the at least two connecting conductors electrically connecting one of the at least two first conductors to one of the at least two second conductors, and the other of the at least two connecting conductors electrically connecting the other of the at least two first conductors to the other of the at least two second conductors;
a plurality of first linking points at least one of inserted in the base portion or connected to the base portion, wherein the linking points mechanically connect the at least two first conductors and the at least two second conductors to the base portion, and
a plurality of second linking points linking the first conductors and the second conductors to a substrate, wherein the substrate is a trellis structure that includes a lattice structure having a plurality of linked slats.

14. The coil arrangement of claim 13, wherein the at least two connecting conductors are flexible.

15. The coil arrangement of claim 13, wherein the at least two first conductors, the at least two second conductors and the connecting conductors form a loop.

16. The coil arrangement of claim 15, wherein a perimeter of the loop is constant.

17. The coil arrangement of claim 13, further comprising a plurality of corner stays around which the connecting conductors are wrapped.

18. The coil arrangement of claim 13, wherein the base portion is shaped as a cylinder.

19. The coil arrangement of claim 13, further comprising:
at least two third conductors oriented in the first direction;
at least two fourth conductors oriented in the second direction;
at least two further connecting conductors, one of the at least two further connecting conductors electrically connecting one of the at least two third conductors to one of the at least two fourth conductors, and the other of the at least two further connecting conductors electrically connecting the other of the at least two third conductors to the other of the at least two fourth conductors; and a plurality of third linking points at least one of inserted in the base portion or connected to the base portion, wherein the further linking points mechanically connect the at least two third conductors and the at least two fourth conductors to the base portion.

20. The coil arrangement of claim 19, wherein the at least two first conductors and the at least two second conductors form a first loop and the at least two third conductors and the at least two fourth conductors form a second loop.

21. The coil arrangement of claim 20, wherein the first loop and the second loop overlap.

* * * * *

UNITED STATES PATENT AND TRADEMARK OFFICE
CERTIFICATE OF CORRECTION

| | |
|---|---|
| PATENT NO. | : 10,551,448 B2 |
| APPLICATION NO. | : 15/495338 |
| DATED | : February 4, 2020 |
| INVENTOR(S) | : Graham Wiggins |

It is certified that error appears in the above-identified patent and that said Letters Patent is hereby corrected as shown below:

In the Specification

Add a paragraph to include a Statement Regarding Federally Sponsored Research, under Column 1, after the "Cross-Reference to Related Application(s)", starting on Line 11 with the following paragraph:
"STATEMENT REGARDING FEDERALLY SPONSORED RESEARCH
This invention was made with government support under grant number P41 EB017183 awarded by The National Institutes of Health. Therefore, the government has certain rights in the invention."

Signed and Sealed this
Seventeenth Day of January, 2023

Katherine Kelly Vidal
*Director of the United States Patent and Trademark Office*